United States Patent
Tamaki et al.

(10) Patent No.: US 9,269,767 B2
(45) Date of Patent: Feb. 23, 2016

(54) POWER SUPERJUNCTION MOSFET DEVICE WITH RESURF REGIONS

(71) Applicant: Renesas Electronics Corporation, Kawasaki-shi, Kanagawa (JP)

(72) Inventors: Tomohiro Tamaki, Kanagawa (JP); Yoshito Nakazawa, Kanagawa (JP); Satoshi Eguchi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/743,897

(22) Filed: Jun. 18, 2015

(65) Prior Publication Data

US 2015/0287778 A1   Oct. 8, 2015

Related U.S. Application Data

(63) Continuation of application No. 14/309,651, filed on Jun. 19, 2014, now Pat. No. 9,093,288, which is a continuation of application No. 13/910,352, filed on Jun. 5, 2013, now Pat. No. 8,786,046, which is a continuation of application No. 12/949,765, filed on Nov. 18, 2010, now abandoned.

(30) Foreign Application Priority Data

Nov. 19, 2009   (JP) .................... 2009-263600

(51) Int. Cl.
*H01L 29/06* (2006.01)
*H01L 29/10* (2006.01)
(Continued)

(52) U.S. Cl.
CPC .......... *H01L 29/0634* (2013.01); *H01L 29/063* (2013.01); *H01L 29/0619* (2013.01);
(Continued)

(58) Field of Classification Search
CPC ............ H01L 29/0634; H01L 29/0619; H01L 29/063; H01L 29/0638; H01L 29/0696; H01L 29/1095; H01L 29/402; H01L 29/7395; H01L 29/7811
USPC ......................................................... 257/337
See application file for complete search history.

(56) References Cited

U.S. PATENT DOCUMENTS 4,691,224 A    9/1987   Takada
5,804,864 A    9/1998   Akiyama
(Continued)

FOREIGN PATENT DOCUMENTS

JP    59-76466 A    1/1984
JP    6-97469 A     4/1994
(Continued)

OTHER PUBLICATIONS

Office Action issued Feb. 26, 2015, in Japanese Patent Application No. 2014-097408.
(Continued)

*Primary Examiner* — Peter Bradford
(74) *Attorney, Agent, or Firm* — Shapiro, Gabor and Rosenberger, PLLC

(57) ABSTRACT

A semiconductor device which solves the following problem of a super junction structure: due to a relatively high concentration in the body cell region (active region), in peripheral areas (peripheral regions or junction end regions), it is difficult to achieve a breakdown voltage equivalent to or higher than in the cell region through a conventional junction edge terminal structure or resurf structure. The semiconductor device includes a power MOSFET having a super junction structure formed in the cell region by a trench fill technique. Also, super junction structures having orientations parallel to the sides of the cell region are provided in a drift region around the cell region.

10 Claims, 35 Drawing Sheets

(51) Int. Cl.
*H01L 29/40* (2006.01)
*H01L 29/78* (2006.01)
*H01L 29/739* (2006.01)

(52) U.S. Cl.
CPC ........ *H01L29/0638* (2013.01); *H01L 29/0696* (2013.01); *H01L 29/1095* (2013.01); *H01L 29/402* (2013.01); *H01L 29/7395* (2013.01); *H01L 29/7811* (2013.01)

(56) References Cited

U.S. PATENT DOCUMENTS

| | | | |
|---|---|---|---|
| 5,804,868 | A | 9/1998 | Kobayashi et al. |
| 6,696,728 | B2 | 2/2004 | Onishi et al. |
| 6,831,345 | B2 | 12/2004 | Kinoshita et al. |
| 6,844,592 | B2 | 1/2005 | Yamaguchi et al. |
| 2001/0028083 | A1 | 10/2001 | Onishi et al. |
| 2002/0074596 | A1 | 6/2002 | Suzuki et al. |
| 2002/0167020 | A1 | 11/2002 | Iwamoto et al. |
| 2002/0171093 | A1 | 11/2002 | Onishi et al. |
| 2003/0052329 | A1 | 3/2003 | Kobayashi et al. |
| 2003/0222327 | A1 | 12/2003 | Yamaguchi et al. |
| 2004/0238884 | A1 | 12/2004 | Tanaka et al. |
| 2005/0048701 | A1 | 3/2005 | Minato et al. |
| 2005/0098826 | A1 | 5/2005 | Yamaguchi et al. |
| 2006/0043478 | A1 | 3/2006 | Yamaguchi et al. |
| 2006/0216896 | A1 | 9/2006 | Saito et al. |
| 2007/0029597 | A1 | 2/2007 | Lee et al. |
| 2007/0080422 | A1 | 4/2007 | Falck et al. |
| 2007/0176244 | A1 | 8/2007 | Yoshikawa |
| 2007/0272977 | A1* | 11/2007 | Saito ................. H01L 29/0634 257/329 |
| 2007/0290267 | A1 | 12/2007 | Yoshikawa et al. |
| 2009/0079002 | A1 | 3/2009 | Lee et al. |
| 2009/0085146 | A1 | 4/2009 | Aoki |
| 2009/0101974 | A1 | 4/2009 | Saito et al. |
| 2009/0236697 | A1 | 9/2009 | Ono et al. |
| 2010/0022075 | A1 | 1/2010 | Takahashi et al. |
| 2010/0032791 | A1 | 2/2010 | Hozumi et al. |
| 2010/0059818 | A1 | 3/2010 | Sasaki |
| 2011/0115033 | A1 | 5/2011 | Tamaki et al. |
| 2012/0161231 | A1 | 6/2012 | Tamaki et al. |

FOREIGN PATENT DOCUMENTS

| | | |
|---|---|---|
| JP | 2002-280555 A | 9/2002 |
| JP | 2003-101039 A | 4/2003 |
| JP | 2003-273355 A | 9/2003 |
| JP | 2006-269720 A | 10/2006 |
| JP | 2007-116190 A | 5/2007 |
| JP | 2008-294028 A | 12/2008 |
| JP | 2009-111237 A | 5/2009 |
| JP | 2009-530829 A | 8/2009 |
| WO | WO 2007/106658 A2 | 9/2007 |
| WO | WO 2009/039441 A1 | 3/2009 |

OTHER PUBLICATIONS

T. Trajkovic et al., "The effect of static and dynamic parasitic charge in the termination area of high voltage devices and possible solutions," pp. 263-266, ISPSD'May 22-25, 2000, Toulouse, France.

Office Action (Notification of Reasons for Refusal) dated Dec. 19, 2013, in Japanese Patent Application No. 2009-263600.

* cited by examiner

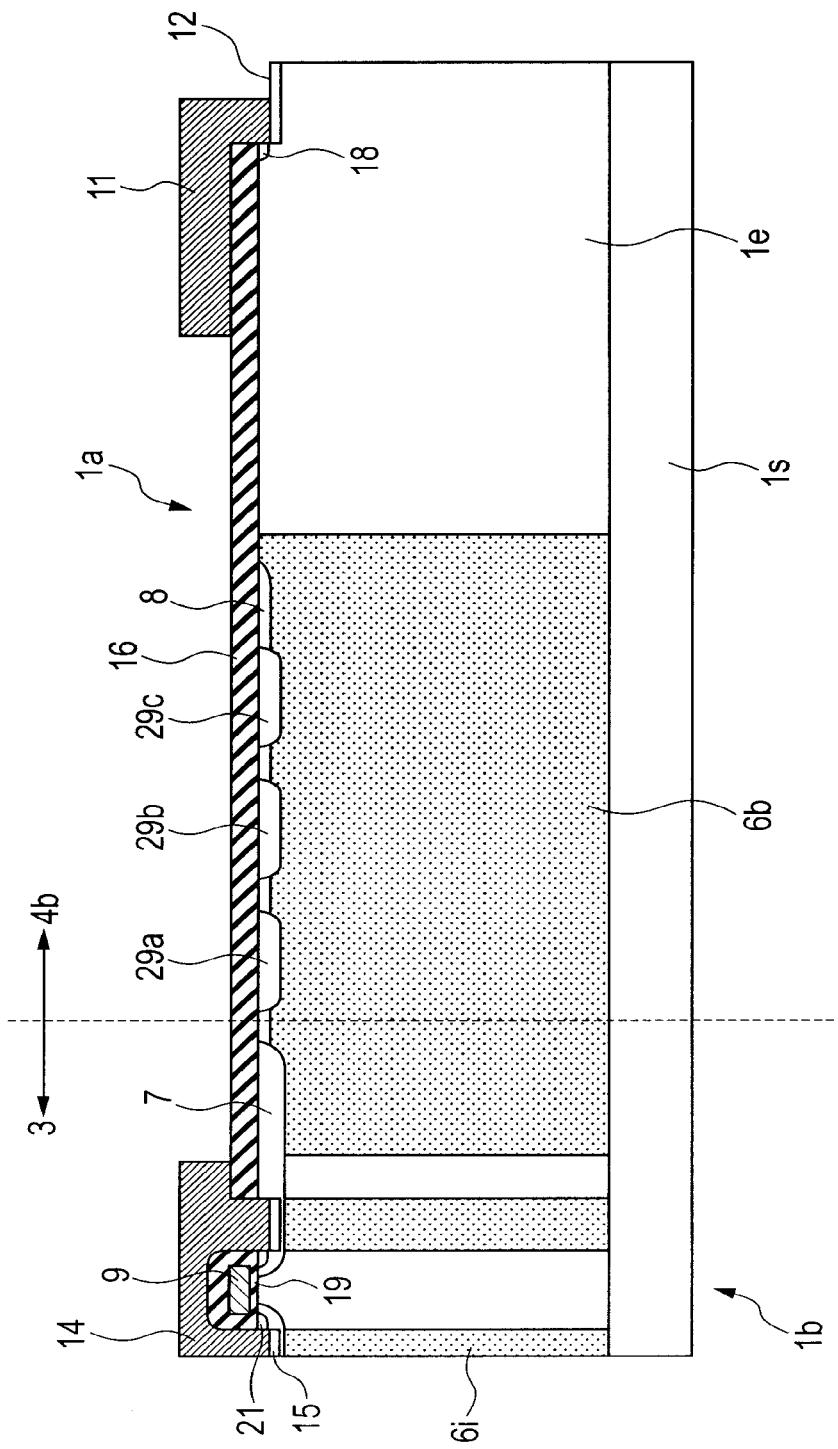

POWER SUPERJUNCTION MOSFET DEVICE WITH RESURF REGIONS

CROSS-REFERENCE TO RELATED APPLICATIONS

The disclosure of Japanese Patent Application No. 2009-263600 filed on Nov. 19, 2009 including the specification, drawings and abstract is incorporated herein by reference in its entirety.

BACKGROUND OF THE INVENTION

The present invention relates to semiconductor devices (or semiconductor integrated circuit devices) and a cell peripheral layout technique or a breakdown voltage enhancement technique in a method for manufacturing a semiconductor device (or semiconductor integrated circuit device).

Japanese Unexamined Patent Publication No. 2007-116190 and US Patent Publication 2005-098826 disclose various structures relating to layout of the vicinity of a cell region in a power MOSFET (Metal Oxide Semiconductor Field Effect Transistor) with a super junction structure which is manufactured by a multi-epitaxial technique or a trench insulating film filling technique (implantation of ions into trenches). These structures include P− resurf (reduced surface field) regions, ring-shaped peripheral P type drift regions based on a multi-epitaxial technique, vertically arranged linear peripheral P type drift regions based on a trench insulating film filling technique, and linear peripheral P type drift regions divided and arranged vertically/in parallel.

SUMMARY OF THE INVENTION

Regarding drift regions of power MOSFETs or the like, an important issue is to develop a high breakdown voltage FET with low on-resistance or the like beyond the traditional silicon limit. In this direction, various methods for introducing a super junction structure have been developed, in which the super junction structure has slab-shaped N type columns and P type columns arranged alternately in a drift region with a relatively high doping concentration. The techniques for introducing a super junction structure are roughly divided into three categories: multi-epitaxial technique, trench insulating film filling technique, and trench fill technique (trench filling or trench epitaxial filling). Among them, the multi-epitaxial technique, in which epitaxial growth and ion implantation are repeated many times, allows wide latitude in process and design but requires high cost because it involves a complicated process. The trench insulating film filling technique, in which ions are obliquely implanted in a trench and the trench is then filled with insulating film by CVD (Chemical Vapor Deposition), is simpler but disadvantageous in terms of size because it requires a trench area.

On the other hand, the trench fill technique offers an advantage that the process is simple, although it allows less latitude in process and design because of restrictions for buried epitaxial growth. For this reason, the present inventors studied issues related to the structures of devices such as power MOSFETs and mass production thereof in connection with the trench fill technique for realizing high breakdown voltage and low on-resistance, and have found the following problem. In a super junction structure, because the body cell region (active region) has a relatively high doping concentration, it is difficult to achieve, in peripheral areas (peripheral regions and junction end regions), a breakdown voltage equivalent to or higher than that in the cell region through a conventional junction edge termination structure or resurf (reduced surface field) structure.

The present invention has been made to solve this problem.

An object of the present invention is to provide a semiconductor device as a solid active device or the like with high breakdown voltage and low on-resistance.

The above and further objects and novel features of the invention will more fully appear from the following detailed description in this specification and the accompanying drawings.

A typical preferred embodiment of the present invention which is disclosed herein is briefly outlined below.

According to one aspect of the present invention, in a semiconductor device including a power MOSFET having a super junction structure formed in a cell region by a trench fill technique, a drift region around the cell region has a super junction structure having an orientation parallel to each side of the cell region.

The advantageous effect achieved by a preferred embodiment is briefly outlined below.

Since in a semiconductor device including a power MOSFET having a super junction structure formed in a cell region by a trench fill technique, a drift region around the cell region has a super junction structure having an orientation parallel to each side of the cell region, a drop in breakdown voltage around the cell region can be effectively prevented.

BRIEF DESCRIPTION OF THE DRAWINGS

FIG. 35 is a sectional view of the device essential part, corresponding to FIG. 21, etc. (virtually corresponding to the sectional view taken along the line B-B' of FIG. 19) for additional illustration of the floating field ring or field limiting ring applied to the device structure (3D resurf structure) of a power MOSFET as a semiconductor device according to the second embodiment of the invention.

DETAILED DESCRIPTION OF THE PREFERRED EMBODIMENTS

Summary of the Preferred Embodiments

Figure 1:
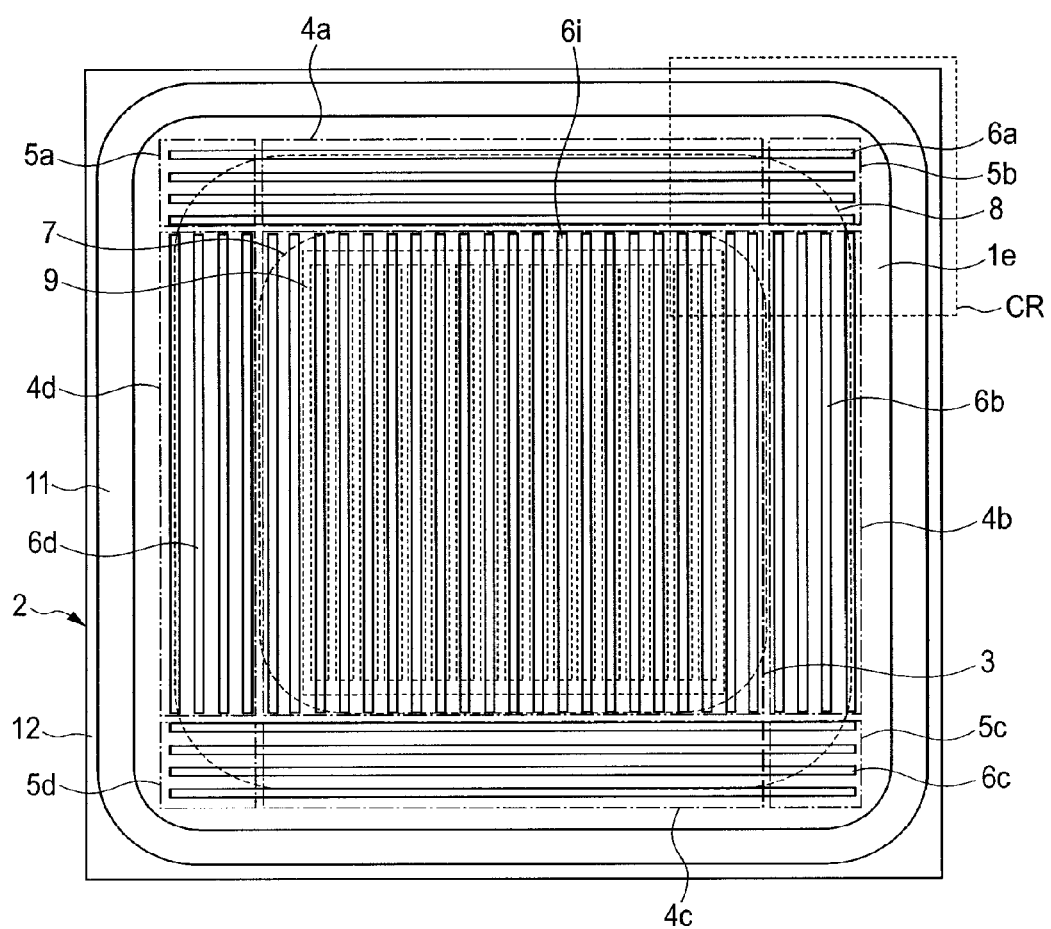
FIG. 1 is a plan view of layout of the whole chip in the device structure of a power MOSFET (2D resurf structure) as a semiconductor device according to a first embodiment of the invention.

First, typical embodiments of the present invention are outlined below.

1. A semiconductor device which includes: (a) a semiconductor chip having a first main surface with a source electrode of a power MOSFET thereon and a second main surface with a drain electrode of the power MOSFET thereon; (b) a virtually rectangular cell region provided almost in the center of the first main surface, a peripheral side region provided along each side of the cell region, and a peripheral corner region provided in each corner of the cell region; (c) a first-conductivity type drift region provided in virtually whole surfaces of the cell region, each peripheral side region, and each peripheral corner region on the first main surface of the semiconductor chip; (d) a first super junction structure provided in the drift region on a virtually whole surface of the cell region, having a first orientation; (e) a second and a third super junction structure provided in the drift region of the peripheral side regions on both sides of the cell region in a direction perpendicular to the first orientation of the first super junction structure, having almost the same length and orientation as the first super junction structure; and (f) a fourth and a fifth super junction structure provided in the drift region of the peripheral side regions on both sides of the cell region in the first orientation of the first super junction structure, having an orientation almost perpendicular to the first super junction structure.

2. The semiconductor device described above in 1, wherein the first to fifth super junction structures are of a trench epitaxial buried type.

3. The semiconductor device described above in 1 or 2, which further includes (g) virtually L-shaped columns each interconnecting a pair of columns configuring the second to fifth super junction structures in each peripheral corner region.

4. The semiconductor device described above in 3, wherein each of the virtually L-shaped columns forms a continuous pattern with a virtually orthogonal bend at a middle point.

5. The semiconductor device described above in 3, wherein each of the virtually L-shaped columns forms a pattern with a pair of columns separated at a middle point and oriented perpendicularly to each other.

6. The semiconductor device described above in 3, wherein each of the virtually L-shaped columns includes a continuous pattern with a pair of columns separated at a middle point and oriented perpendicularly to each other, and an auxiliary column located near and outside a point where the paired columns meet.

7. The semiconductor device described in any of 1 to 6, wherein a surface resurf region is provided in at least part of each peripheral side region or each peripheral corner region in a surface region of the drift region on the first main surface so as to surround the cell region.

8. The semiconductor device described in any of 1 to 7, wherein a field plate extends above part of the surface resurf region.

9. The semiconductor device described in any of 1 to 8, wherein one or a plurality of floating field rings are provided in at least part of each peripheral side region or each peripheral corner region in a surface region of the drift region on the first main surface so as to surround the cell region.

10. The semiconductor device described in any of 1 to 9, wherein the surface resurf region is divided into a plurality of regions.

11. A semiconductor device which includes: (a) a semiconductor chip having a first main surface with a source electrode of a power MOSFET thereon and a second main surface with a drain electrode of the power MOSFET thereon; (b) a virtually rectangular cell region provided almost in the center of the first main surface, a peripheral side region provided along each side of the cell region, and a peripheral corner region provided in each corner of the cell region; (c) a first-conductivity type drift region provided in virtually whole surfaces of the cell region, each peripheral side region, and each peripheral corner region on the first main surface of the semiconductor chip; (d) a first super junction structure provided in the drift region on a virtually whole surface of the cell region, having a first orientation; (e) a second and a third super junction structure provided in the drift region of the peripheral side regions on both sides of the cell region in the first orientation of the first super junction structure, having almost the same orientation as the first super junction structure; and (f) a fourth and a fifth super junction structure provided in the drift region of the peripheral side regions on both sides of the cell region in a direction perpendicular to the first orientation of the first super junction structure, having an orientation almost perpendicular to the first super junction structure.

12. The semiconductor device described above in 11, wherein the second and third super junction structures are coupled to the first super junction structure.

13. The semiconductor device described above in 11 or 12, wherein the first to fifth super junction structures are of a trench epitaxial buried type.

14. The semiconductor device described in any of 11 to 13, wherein the fourth and fifth super junction structures are provided across each peripheral corner region.

15. The semiconductor device described in any of 11 to 14, wherein a surface resurf region is provided in at least part of each peripheral side region or each peripheral corner region in a surface region of the drift region on the first main surface so as to surround the cell region.

16. The semiconductor device described in any of 11 to 15, wherein a field plate extends above part of the surface resurf region.

17. The semiconductor device described in any of 11 to 16, wherein one or a plurality of floating field rings are provided in at least part of each peripheral side region or each peripheral corner region in a surface region of the drift region on the first main surface so as to surround the cell region.

18. The semiconductor device described in any of 11 to 17, wherein the surface resurf region is divided into a plurality of regions.

19. A method for manufacturing a semiconductor device, in which the semiconductor device includes: (a) a semiconductor chip region on a wafer having a first main surface with a source electrode of a power MOSFET thereon and a second main surface with a drain electrode of the power MOSFET thereon; (b) a virtually rectangular cell region provided almost in the center of the first main surface, a peripheral side region provided along each side of the cell region, and a peripheral corner region provided in each corner of the cell region; (c) a first-conductivity type drift region provided in virtually whole surfaces of the cell region, each peripheral side region, and each peripheral corner region on the first main surface of the semiconductor chip; (d) a first super junction structure provided in the drift region on a virtually whole surface of the cell region, having a first orientation; (e) a second and a third super junction structure provided in the drift region of the peripheral side regions on both sides of the cell region in a direction perpendicular to the first orientation of the first super junction structure, having almost the same length and orientation as the first super junction structure; and (f) a fourth and a fifth super junction structure provided in the drift region of the peripheral side regions on both sides of the cell region in the first orientation of the first super junction structure, having an orientation almost perpendicular to the first super junction structure, wherein the first to fifth super junction structures are formed by a trench epitaxial filling technique.

20. A method for manufacturing a semiconductor device, in which the semiconductor device includes: (a) a semiconductor chip region on a wafer having a first main surface with a source electrode of a power MOSFET thereon and a second main surface with a drain electrode of the power MOSFET thereon; (b) a virtually rectangular cell region provided almost in the center of the first main surface, a peripheral side region provided along each side of the cell region, and a peripheral corner region provided in each corner of the cell region; (c) a first-conductivity type drift region provided in virtually whole surfaces of the cell region, each peripheral side region, and each peripheral corner region on the first main surface of the semiconductor chip; (d) a first super junction structure provided in the drift region on a virtually whole surface of the cell region, having a first orientation; (e) a second and a third super junction structure provided in the drift region of the peripheral side regions on both sides of the cell region in the first orientation of the first super junction structure and coupled to the first super junction structure, having almost the same length and orientation as the first super junction structure; and (f) a fourth and a fifth super junction structure provided in the drift region of the peripheral side regions on both sides of the cell region in a direction perpendicular to the first orientation of the first super junction structure, having an orientation almost perpendicular to the first super junction structure, wherein the first to fifth super junction structures are formed by a trench epitaxial filling technique.

Next, other embodiments of the present invention will be outlined.

1. A semiconductor device which includes: (a) a semiconductor chip having a first main surface with a source electrode of a power MOSFET thereon and a second main surface with a drain electrode of the power MOSFET thereon; (b) a virtually rectangular cell region provided almost in the center of the first main surface and a cell peripheral region surrounding it; (c) a first-conductivity type drift region provided in virtually whole surfaces of the cell region and the cell peripheral region on the first main surface of the semiconductor chip; (d) a first super junction structure provided in the drift region on a virtually whole surface of the cell region, having a first orientation; (e) a second and a third super junction structure provided in the drift region of the cell peripheral region on both sides of the cell region in a direction perpendicular to the first orientation of the first super junction structure, having almost the same length and orientation as the first super junction structure; and (f) a fourth and a fifth super junction structure provided in the drift region of the cell peripheral region except portions containing the second and third super junction structures, having an orientation almost perpendicular to the first super junction structure, wherein the first to fifth super junction structures are of a trench epitaxial buried type.

2. The semiconductor device described in 1, wherein a surface resurf region is provided in at least part of the cell peripheral region in a surface region of the drift region on the first main surface so as to surround the cell region.

3. The semiconductor device described in 2, wherein a field plate extends above part of the surface resurf region.

4. The semiconductor device described in 2 or 3, wherein one or a plurality of floating field rings are provided in at least part of the cell peripheral region in a surface region of the drift region on the first main surface so as to surround the cell region.

5. The semiconductor device described in any of 2 to 4, wherein the surface resurf region is divided into a plurality of regions.

6. A semiconductor device which includes: (a) a semiconductor chip having a first main surface with a source electrode of a power MOSFET thereon and a second main surface with a drain electrode of the power MOSFET thereon; (b) a virtually rectangular cell region provided almost in the center of the first main surface and a cell peripheral region surrounding it; (c) a first-conductivity type drift region provided in virtually whole surfaces of the cell region and the cell peripheral region on the first main surface of the semiconductor chip; (d) a first super junction structure provided in the drift region on a virtually whole surface of the cell region, having a first orientation; (e) a second and a third super junction structure provided in the drift region of the cell peripheral region on both sides of the cell region in the first orientation of the first super junction structure and coupled to the first super junction structure, having almost the same orientation as the first super junction structure; and (f) a fourth and a fifth super junction structure provided in the drift region of the cell peripheral region except portions containing the second and third super junction structures, having an orientation almost perpendicular to the first super junction structure, wherein the first to fifth super junction structures are of a trench epitaxial buried type.

7. The semiconductor device described in 6, wherein a surface resurf region is provided in at least part of the cell peripheral region in a surface region of the drift region on the first main surface so as to surround the cell region.

8. The semiconductor device described in 7, wherein a field plate extends above part of the surface resurf region.

9. The semiconductor device described in 7 or 8, wherein one or a plurality of floating field rings are provided in at least part of the peripheral cell region in a surface region of the drift region on the first main surface so as to surround the cell region.

10. The semiconductor device described in any of 7 to 9, wherein the surface resurf region is divided into a plurality of regions.

11. A semiconductor device which includes: (a) a semiconductor chip having a first main surface with a source electrode of a power MOSFET thereon and a second main surface with a drain electrode of the power MOSFET thereon; (b) a virtually rectangular cell region provided almost in the center of the first main surface and a cell peripheral region surrounding it; (c) a first-conductivity type drift region provided in virtually whole surfaces of the cell region and the cell peripheral region on the first main surface of the semiconductor chip; (d) a first super junction structure provided in the drift region on a virtually whole surface of the cell region, having a first orientation; (e) a second and a third super junction structure provided in the drift region of the cell peripheral region on both sides of the cell region in a direction perpendicular to the first orientation of the first super junction structure, having almost the same length and orientation as the first super junction structure; and (f) a fourth and a fifth super junction structure provided in the drift region of the cell peripheral region except portions containing the second and third super junction structures and peripheral corner regions, having an orientation almost perpendicular to the first super junction structure; and (g) virtually L-shaped columns each interconnecting a pair of columns configuring the second to fifth super junction structures in each peripheral corner region, wherein the first to fifth super junction structures are of a trench epitaxial buried type.

12. The semiconductor device described in 11, wherein each of the virtually L-shaped columns forms a continuous pattern with a virtually orthogonal bend at a middle point.

13. The semiconductor device described in 11, wherein each of the virtually L-shaped columns forms a pattern with a pair of columns separated at a middle point and oriented perpendicularly to each other.

14. The semiconductor device described in 11, wherein each of the virtually L-shaped columns comprises a continuous pattern with a pair of columns separated at a middle point and oriented perpendicularly to each other, and an auxiliary column located near and outside a point where the paired columns meet.

15. The semiconductor device described in any of 11 to 14, wherein a surface resurf region is provided in at least part of the cell peripheral region in a surface region of the drift region on the first main surface so as to surround the cell region.

16. The semiconductor device described in 15, wherein a field plate extends above part of the surface resurf region.

17. The semiconductor device described in 15 or 16, wherein one or a plurality of floating field rings are provided in at least part of the cell peripheral region in a surface region of the drift region on the first main surface so as to surround the cell region.

18. The semiconductor device described in any of 15 to 17, wherein the surface resurf region is divided into a plurality of regions.

19. A method for manufacturing a semiconductor device, in which the semiconductor device includes: (a) a semiconductor chip region on a wafer having a first main surface with a source electrode of a power MOSFET thereon and a second main surface with a drain electrode of the power MOSFET thereon; (b) a virtually rectangular cell region provided almost in the center of the first main surface and a cell peripheral region surrounding it; (c) a first-conductivity type drift region provided in virtually whole surfaces of the cell region and the cell peripheral region on the first main surface of the semiconductor chip; (d) a first super junction structure provided in the drift region on a virtually whole surface of the cell region, having a first orientation; (e) a second and a third super junction structure provided in the drift region of the cell peripheral region on both sides of the cell region in a direction perpendicular to the first orientation of the first super junction structure, having almost the same length and orientation as the first super junction structure; and (f) a fourth and a fifth super junction structure provided in the drift region of the cell peripheral region except portions containing the second and third super junction structures, having an orientation almost perpendicular to the first super junction structure, in which the first to fifth super junction structures are formed by a trench epitaxial filling technique.

20. A method for manufacturing a semiconductor device, in which the semiconductor device includes: (a) a semiconductor chip region on a wafer having a first main surface with a source electrode of a power MOSFET thereon and a second main surface with a drain electrode of the power MOSFET thereon; (b) a virtually rectangular cell region provided almost in the center of the first main surface and a cell peripheral region surrounding it; (c) a first-conductivity type drift region provided in virtually whole surfaces of the cell region and the cell peripheral region on the first main surface of the semiconductor chip; (d) a first super junction structure provided in the drift region on a virtually whole surface of the cell region, having a first orientation; (e) a second and a third super junction structure provided in the drift region of the cell peripheral region on both sides of the cell region in the first orientation of the first super junction structure and coupled to the first super junction structure, having almost the same length and orientation as the first super junction structure; and (f) a fourth and a fifth super junction structure provided in the drift region of the cell peripheral region except portions containing the second and third super junction structures, having an orientation almost perpendicular to the first super junction structure, wherein the first to fifth super junction structures are formed by a trench epitaxial filling technique.

Rules of Description in the Specification

1. The preferred embodiments may be described separately in different sections as necessary, but such descriptions are not irrelevant to each other unless otherwise specified. One description may be, in part, a detailed form of another or one description may describe, in whole or in part, a variation of what is described in another. Basically, the same explanations are not repeated. In the preferred embodiments, even when a specific numerical value is indicated for an element, the numerical value is not essential for the element unless otherwise specified or unless limited to the numerical value theoretically or obviously in the context.

Here the term "semiconductor device" mainly refers to various discrete transistors (active devices) or semiconductor chips or the like (for example, single-crystal silicon substrates) on which resistors and capacitors are integrated with such transistors. Among such transistors are typically MISFETs (Metal Insulator Semiconductor Field Effect Transistors) including MOSFETs (Metal Oxide Semiconductor Field Effect Transistors). Typical discrete transistors include power MOSFETs and IGBTs (Insulated Gate Bipolar Transistors).

2. When a material or composition in an embodiment of the invention is described, the expression "X comprising A" or "X which comprises A" does not exclude a main component other than A unless otherwise specified or unless exclusion of another component is obvious in the context. If the expression concerns a main component, it means "X which includes A as a main component". For example, the term "silicon member" represents not only a member made of pure silicon but also a member made of a multi-component alloy which contains SiGe alloy or another type of silicon as a main component and an additive. Similarly, the terms "silicon oxide film," "silicon oxide insulating film" and so on obviously refer to not only relatively pure undoped silicon dioxide film but also thermally oxidized film, CVD oxidized film or SOG (Spin ON Glass) film of FSG (Fluorosilicate Glass), TEOS-based silicon oxide, SiOC (Silicon Oxicarbide), carbon-doped silicon oxide, OSG (Organosilicate glass), PSG (Phosphorus Silicate Glass) or BPSG (Borophosphosilicate Glass), or NCS (Nano-Clustering Silica) coating type oxide silicon, silica low-k insulating film with vacant holes in a similar material (porous insulating film) or film combined with other silicon insulating film using any of them as a main component.

Along with silicon oxide insulating film, silicon nitride insulating film is commonly used as a silicon insulating film in the semiconductor field. Materials for this type of film include SiN, SiCN, SiNH, and SiCNH. The term "silicon nitride" here includes both SiN and SiNH unless otherwise specified. Similarly, "SiCN" here includes both SiCN and SiCNH.

Though SiC has properties similar to those of SiN, SION should be classified as silicon oxide insulator in many cases.

3. Similarly, figures, positions, and attributes are expressed by preferred examples here; however it is needless to say that they are not limited to these examples in a strict sense unless otherwise specified or unless obviously limited so in the context.

4. Also, even when a volume or value is indicated by a specific numerical value, it is not limited to the specific numerical value unless otherwise specified or unless limited to the numerical value theoretically or obviously in the context; it may be larger or smaller than the specific numerical value.

5. The term "wafer" generally refers to a single-crystal silicon wafer on which a semiconductor device (including a semiconductor integrated circuit device or electronic device) is formed. However, it is needless to say that it also includes a wafer which combines an insulating substrate, such as an epitaxial wafer, SOI substrate or LCD glass substrate, and a semiconductor layer.

6. Generally a super junction structure is a structure that in a conductive semiconductor region with positive or negative polarity, conductive pillar or plate-like column regions with opposite polarity are inserted at virtually regular intervals so as to maintain charge balance. In the present invention, when reference is made to a "super junction structure" formed by a trench fill technique, basically it should be interpreted to be a structure that in a conductive semiconductor region with positive or negative polarity, conductive plate-like "column regions" with opposite polarity (usually plate-like but, in some cases, curved or bent) are inserted at virtually regular intervals so as to maintain charge balance. In the preferred embodiments, P type columns are formed at regular intervals and parallel to each other in an N type semiconductor layer (for example, drift region).

In relation to a super junction structure, "orientation" refers to the longitudinal direction of the super junction structure (on a plane parallel to the main surface of the chip or wafer) when its P type columns or N type columns are viewed two-dimensionally with respect to the main surface of the chip.

In the present invention, regarding a resurf (Reduced Surface Field) structure or junction edge termination structure, a junction edge extension or surface resurf region (specifically "P− type resurf region") refers to a region which is formed in a surface region of a drift region and coupled to an end of a P type body region (P type well region) of a channel region and is the same in polarity as the body region and lower in doping or impurity concentration than the body region. Usually it has the form of a ring around the cell region. A "field plate" refers to a conductor film pattern coupled to a source potential or equivalent potential which extends above a drift region surface (device surface) through an insulating film, in the form of a ring around the cell region. A "floating field ring" or "field limiting ring" refers to an impurity region or a group of impurity regions which is provided in a drift region surface (device surface) separately from a P type body region (P type well region) and is the same in polarity as the body region and similar in concentration to the body region, in the form of a ring or rings around the cell region.

Details of the Preferred Embodiments

The preferred embodiments are further described in detail below. In the drawings, like or similar elements are designated by like or similar symbols or reference numerals and repeated descriptions of such elements are omitted.

In the drawings, hatching may be omitted even for a cross section if hatching may make the illustration complicated or it can be clearly distinguished from a void space. In this connection, the background contour line of a closed hole may be omitted as far as it is clear from an explanation or the like. Furthermore, in a drawing, even if an area is not a cross section, it may be indicated by hatching in order to show that it is not a void space.

Regarding the number of P type columns, three or five columns are shown in a peripheral side region for the convenience of illustration; however, in reality there may be provided ten or more columns. The examples shown here assume that the breakdown voltage is around several hundreds of volts. The examples given below concern a product whose breakdown voltage is several hundreds of volts (for example, 600 volts).

1. Description of the Device Structure (2D Resurf Structure) of a Power MOSFET as a Semiconductor Device According to a First Embodiment of the Invention (See Mainly FIGS. 1 to 4).

Although the super junction structure is also a kind of resurf structure, the resurf structure described in this section is the resurf structure for a P− type surface layer formed over a bulk super junction structure surface of the bulk in a cell peripheral region. In the cell peripheral region, P type columns extend parallel to corresponding sides of the cell region, and in terms of the degree of freedom in electric field directions in the depletion layer extending to the P− type surface layer, the structure also has a 2-degree-of-freedom, specifically the direction from the back surface of the substrate to its front surface and the direction from a chip edge toward the inside of the device main surface; thus this type of resurf structure is called a 2D resurf structure.

Next, the function of the 2D resurf structure will be described. In the trench fill technique, in buried epitaxial growth for the formation of P columns, a cell region and a cell peripheral region are both formed by a single epitaxial growth, so the cell region and cell peripheral region have the same P column impurity concentration. Therefore, the charge balance of the cell region and cell peripheral region can be controlled by the P column width. Regarding charge balance, in order to prevent the breakdown voltage in the cell peripheral region from being significantly lower than in the cell region, the P column width of the cell peripheral region should be the same as that of the cell region so that the same or similar charge balance is kept in the cell region and the cell peripheral region. However, a breakdown voltage equal to or higher than that in the cell region can not be achieved in the cell peripheral region simply by adjusting the charge balance of the bulk super junction structure. The reason is that the depletion layer terminates in a region surrounded by peripheral side regions 4a, 4b, 4c, and 4d adjacent to the four sides of the P type well region 7 and those of the cell region 3 and peripheral corner regions 5a, 5b, 5c, and 5d corresponding to the corners of the chip 2 between them, causing electric field concentration in the vicinity of the edge area of the P type well region 7. Therefore, a P− type surface resurf region 8 is provided on a peripheral region surface to adjust the number of equipotential lines on the N column surface. When a bias is applied to a drain electrode 1b, the bulk super junction structure begins to deplete from the cell region and the bulk super junction structure in the peripheral region depletes radially from the cell region. Here, the depletion layer, which would terminate around the P type well region 7 without the P− type surface resurf region, extends from the inside of the device main surface toward the chip edge due to the presence of the P− type surface resurf region. The P− type surface resurf region can be designed by controlling its impurity concentration so that the number of equipotential lines is uniform along the chip surface in the direction from the inside of the device main surface toward the chip edge. Consequently, a breakdown voltage equal to or higher than that in the cell region can be achieved in the cell peripheral region.

Figure 2:
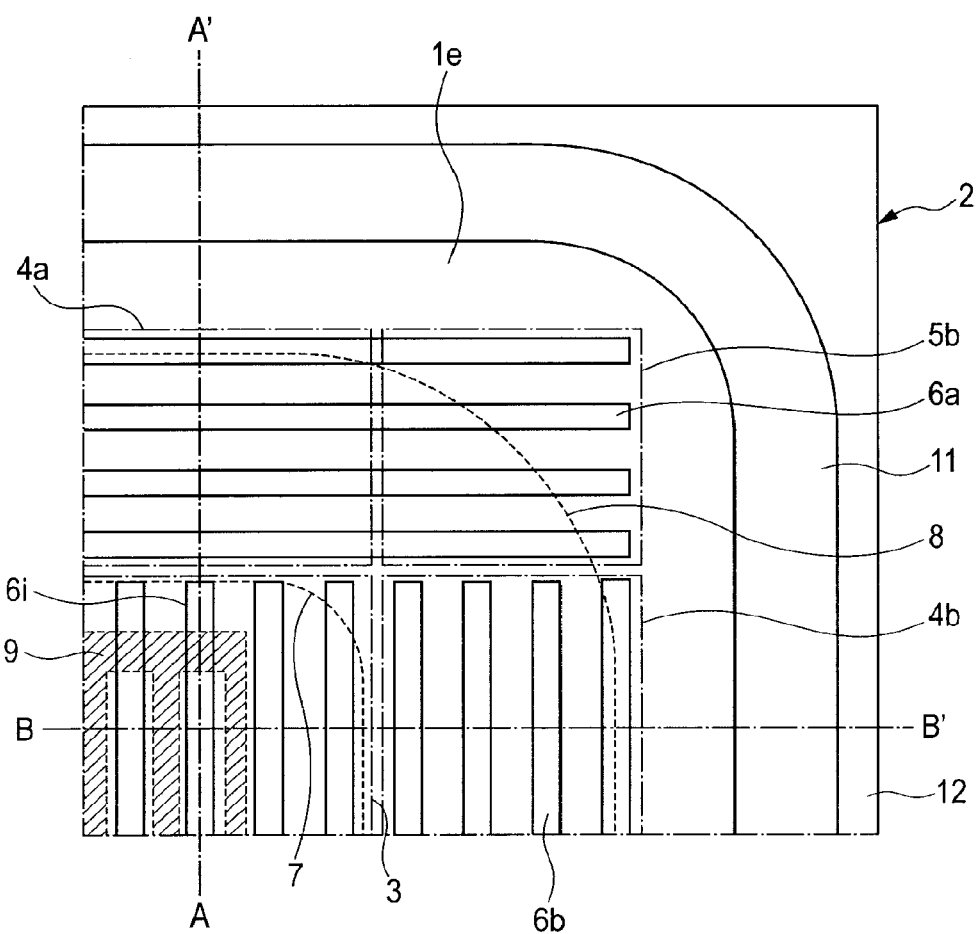
FIG. 2 is an enlarged plan view of layout of a chip corner CR including the right upper end of the cell region in the device structure of the power MOSFET (2D resurf structure) as a semiconductor device according to the first embodiment of the invention.
Figure 3:
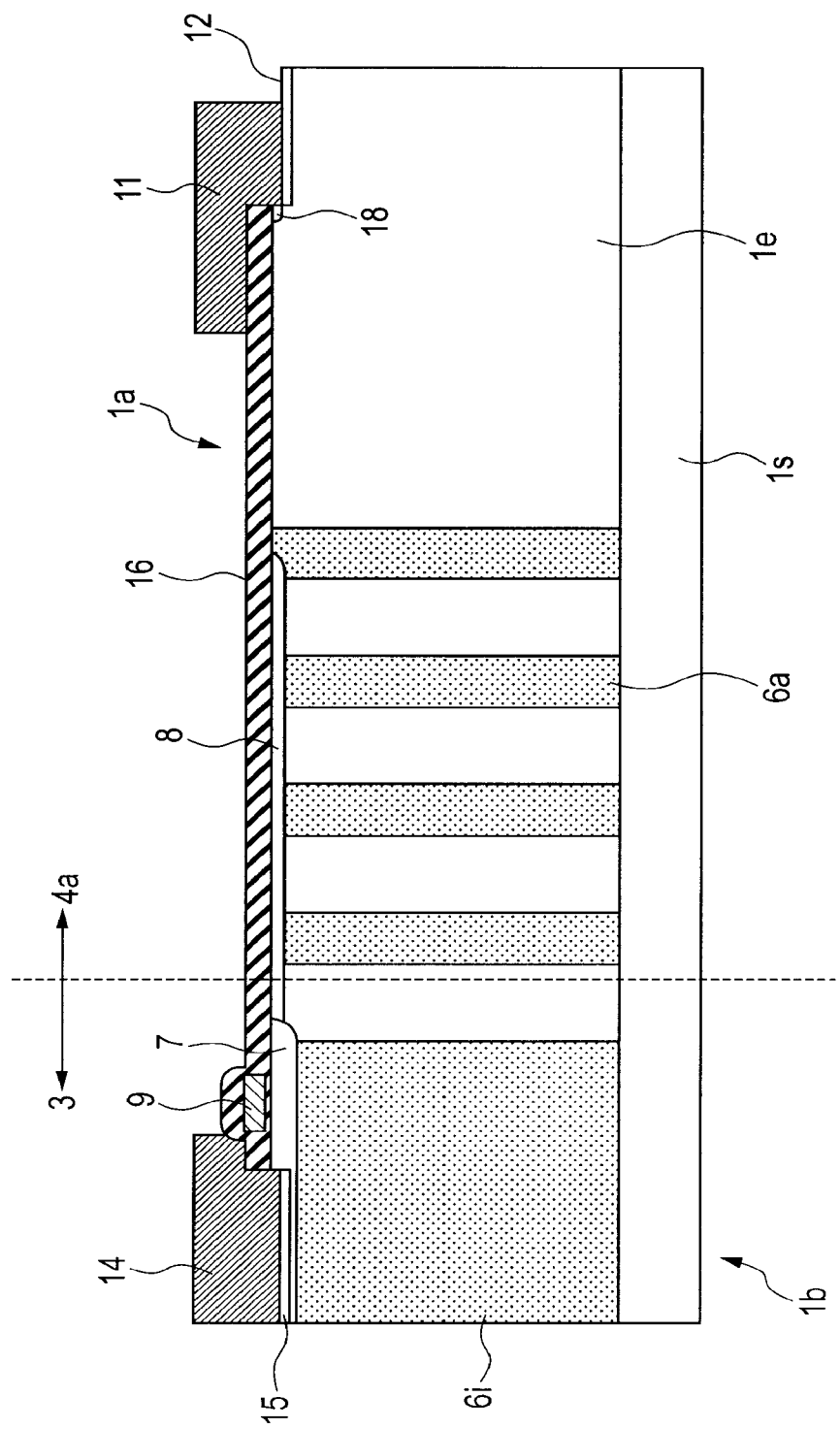
FIG. 3 is a sectional view of an essential part of the device, taken along the line A-A' of FIG. 2.
Figure 4:
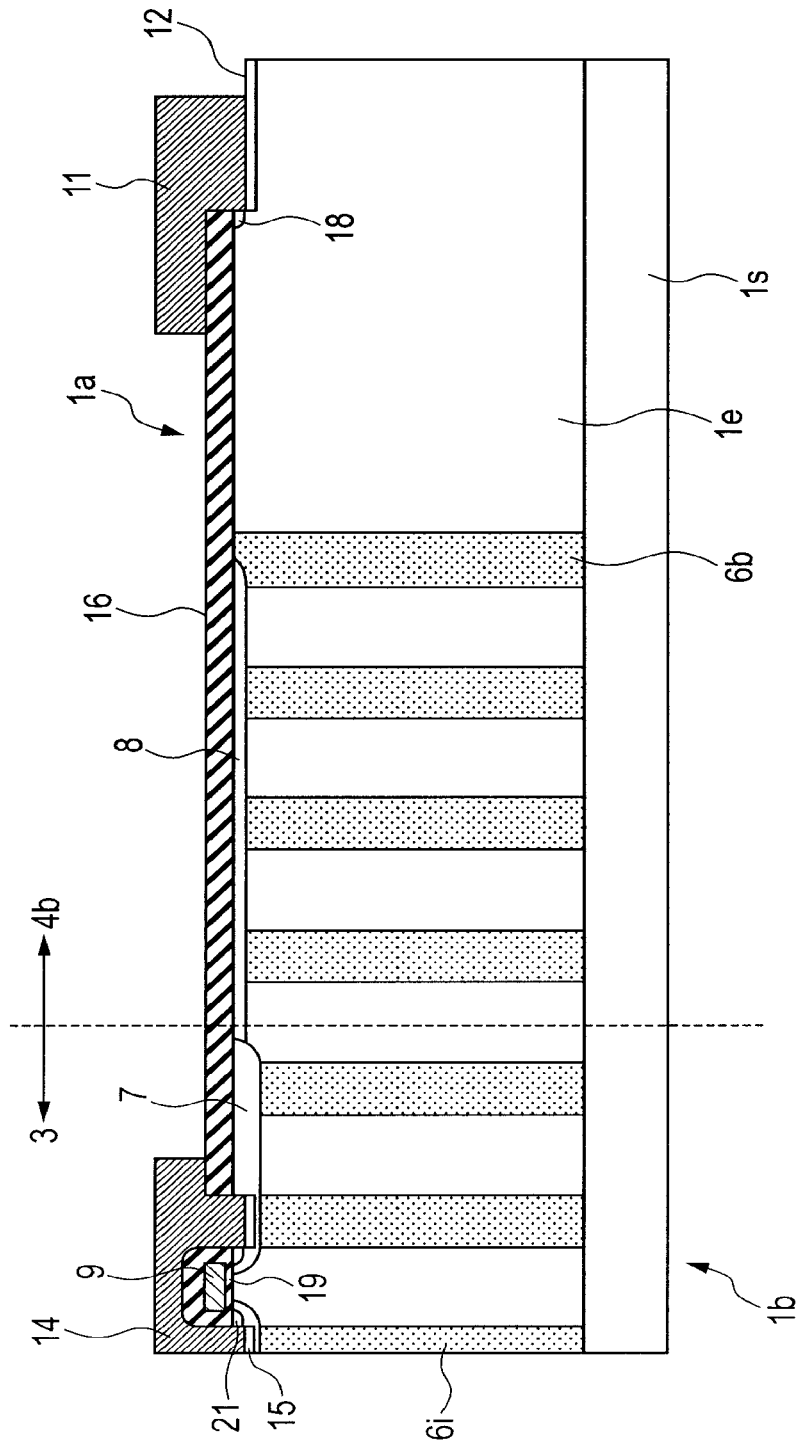
FIG. 4 is a sectional view of an essential part of the device, taken along the line B-B' of FIG. 2.

FIG. 1 is a plan view of layout of the whole chip in the device structure (2D resurf structure) of a power MOSFET as a semiconductor device according to the first embodiment of the invention. FIG. 2 is an enlarged plan view of layout of a chip corner CR including the right upper end of the cell region in the device structure (2D resurf structure) of the power MOSFET as a semiconductor device according to the first embodiment of the invention. FIG. 3 is a sectional view of an essential part of the device, taken along the line A-A' of FIG. 2. FIG. 4 is a sectional view of the essential part of the device, taken along the line B-B' of FIG. 2. Referring to these drawings, the device structure (2D resurf structure) of the power MOSFET as a semiconductor device according to the first embodiment of the invention is described below.

As shown in FIGS. 1 to 4 (mainly FIG. 1), when the semiconductor chip 2 (chip region, in this example, 3 mm square) is viewed from the device main surface 1a (opposite to the back surface 1b of the chip 2) side, it includes a virtually square or rectangular cell region (cell area) 3, a ring-shaped cell peripheral region surrounding it, and a ring-shaped chip end region outside it as a chip end. This cell region 3 includes a linear repetitive gate electrode 9 as a key part of the power MOSFET, P type well region 7 (P type body region) provided in a surface region of an N epitaxial layer 1e (drift region), and super junction structure comprised of many P type columns 6i (namely, a first super junction structure having a first orientation, with a column thickness of 4 micrometers or so and a column interval of 6 micrometers or so). The cell peripheral region includes peripheral side regions 4a, 4b, 4c, and 4d adjacent to the four sides of the cell region 3 and peripheral corner regions 5a, 5b, 5c, and 5d corresponding to the corners of the chip 2 between them. In order to prevent formation of an undesired channel at the chip end, the chip end region has a ring-shaped N+ channel stopper 18 and a ring-shaped guard ring electrode 11 (aluminum metal electrode) coupled to it. In the cell peripheral region, a plurality of P type columns 6b and 6d like P type columns 6i are provided in the N epitaxial layer 1e (drift region) of the peripheral side regions 4b and 4d (namely, a second and a third junction structure having a first orientation, with a column thickness of 4 micrometers or so, a column interval of 6 micrometers or so, and a distance from the end of the columns of the first super junction structure of 3 micrometers or so). The orientation and length of these P type columns 6b and 6d are almost the same as those of the P type columns 6i. Other parts of the cell peripheral region, namely the peripheral side region 4a coupled to a pair of peripheral corner regions, 5a and 5b, and the peripheral side region 4c coupled to a pair of peripheral corner regions, 5c and 5d, have a plurality of P type columns 6a and 6c in the N epitaxial layer 1e (drift region) (namely, a fourth and a fifth super junction structure having an orientation perpendicular to the first orientation). The orientation of the P type columns 6a and 6c is virtually perpendicular to that of the P type column 6i.

Next, details of the layout and its relation with the vertical structure are described referring to FIG. 2 which shows the chip corner CR including the right upper end of the cell region in enlarged form. Since this layout is linearly symmetrical with respect to the centerlines (vertical and horizontal) of the chip and 180 degrees rotationally symmetric with respect to the center of the chip (lead electrodes, source pads and gate pads are not always symmetric in this way), an explanation of one corner and its vicinity is almost equivalent to an explanation of the whole chip 2. Therefore, as for planar layout, an explanation is given below, taking the right upper corner of the chip 2 as an example.

FIG. 3 is a sectional view taken along the line A-A' of FIG. 2. As shown in FIG. 3, an N epitaxial layer 1e (drift region) lies over an N+ silicon single-crystal substrate is and P type columns 6a and 6i penetrate this layer vertically. A P+ contact region 15 is provided in the P type well region 7 (P type body region) on the surface of the epitaxial layer 1e and coupled to a metal source electrode 14 through barrier metal, etc. The P type well region 7 has a P− type surface resurf region 8 (for example, its impurity peak concentration is about $2 \times 10^{16}/cm^3$ and its depth is usually smaller than that of the P type well region 7 and may be in the range of 10-150% of it) as an extension, extending up to the vicinity of the outermost P type column. A field insulating film, etc 16 is provided on the surface of the N epitaxial layer 1e and the gate electrode 9 (gate polysilicon film), etc lies in it. The chip end region includes, in addition to the N+ channel stopper 18 and the ring-shaped guard ring electrode 11 coupled to it, a semiconductor region 12 corresponding to the P+ body contact region at the chip edge, which is formed simultaneously with impurity doping into the cell region 3 and functions as a channel stopper in combination with the N+ channel stopper 18, guard ring electrode 11 and so on.

FIG. 4 is a sectional view taken along the line B-B' of FIG. 2. As shown in FIG. 4, a gate insulating film 19 lies under the gate polysilicon film 9 and an N+ source region 21 is provided on the surface of the P type body region 7 on both sides of the gate electrode 9.

Referring back to FIG. 2, why this layout is necessary is described below. In a device with a super junction structure in the cell region 3, it is possible to decrease the on-resistance while maintaining a vertical breakdown voltage (so-called bulk breakdown voltage). However, since the breakdown voltage of the whole device is likely to be determined by peripheral areas, the cell peripheral region must also have a super junction structure. Since the depletion layer in the cell peripheral region spreads almost radially from the cell region 3, a certain degree of symmetry is required in order to achieve high breakdown voltage. On the other hand, in the trench fill technique, due to limitations by epitaxial growth characteristics, the planar arrangement of the P type columns 6a, 6b, 6c, and 6d is limited to a pattern having mutually orthogonal sides. The freedom in the spread of the depletion layer of the surface resurf layer depends on the electric field components in the depletion layer. Specifically, the electric field components refer to two components: one from the back surface of the substrate to its front surface and one from the chip edge toward the inside of the device main surface, so this type of resurf structure is called a 2D resurf structure. The symmetry of the 2D resurf structure and P type columns is the same as that of the peripheral side regions 4a, 4b, 4c, and 4d. Therefore, in the cell peripheral region, basically the P− type surface resurf structure should be a 2D resurf structure in order to maintain the breakdown voltage in the cell peripheral region efficiently. This is not irrelevant to the peripheral corner regions 5a, 5b, 5c, and 5d unless a very high breakdown voltage is required, because they are different in symmetry from the peripheral side regions 4a, 4b, 4c, and 4d in the spread of the depletion layer in a strict sense.

Further improvement in the super junction structure of the peripheral corner regions 5a, 5b, 5c, and 5d will be described later in Section 5.

2. Summary of the Method for Manufacturing a Semiconductor Device According to the First Embodiment of the Invention (See Mainly FIGS. 5 to 17).

In this section, the manufacturing process for the structure described in Section 1 is described. For other structures, the manufacturing process is basically the same and not repeated.

Figure 5:
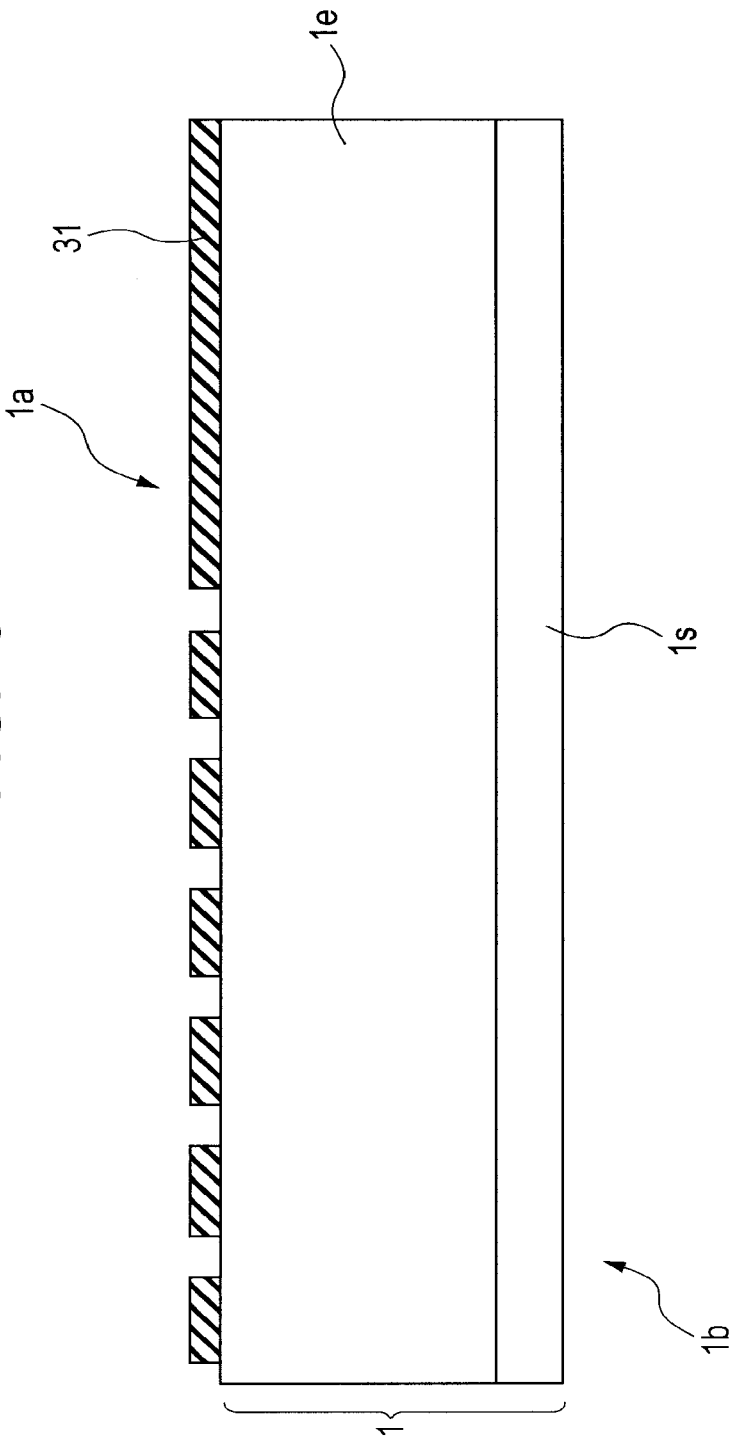
FIG. 5 is a sectional view of an essential part of the device in the wafer process flow of a method for manufacturing a semiconductor device according to the first embodiment of the invention (at the step of patterning a hard mask film for the formation of trenches for P type columns)
Figure 6:
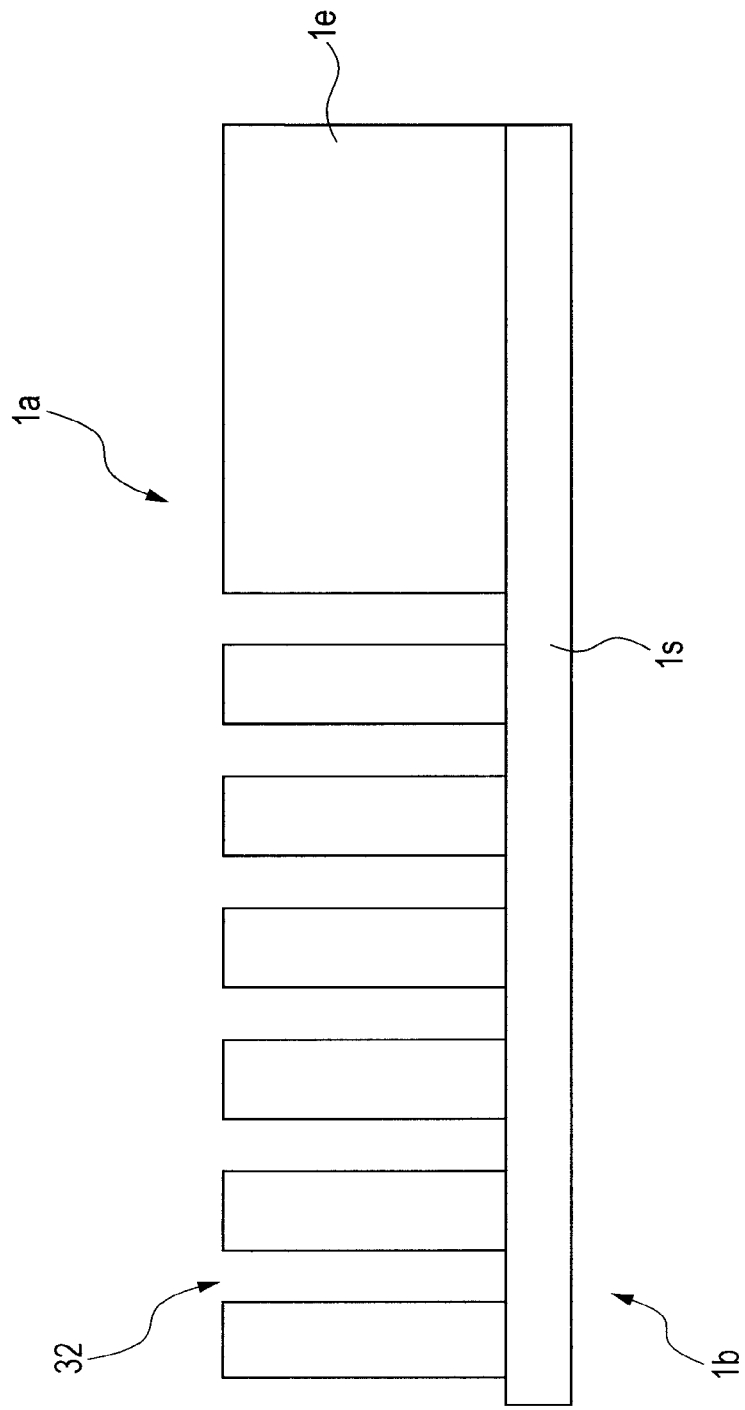
FIG. 6 is a sectional view of the essential part of the device in the wafer process flow of the semiconductor device manufacturing method (at the step of forming trenches for P type columns)
Figure 7:
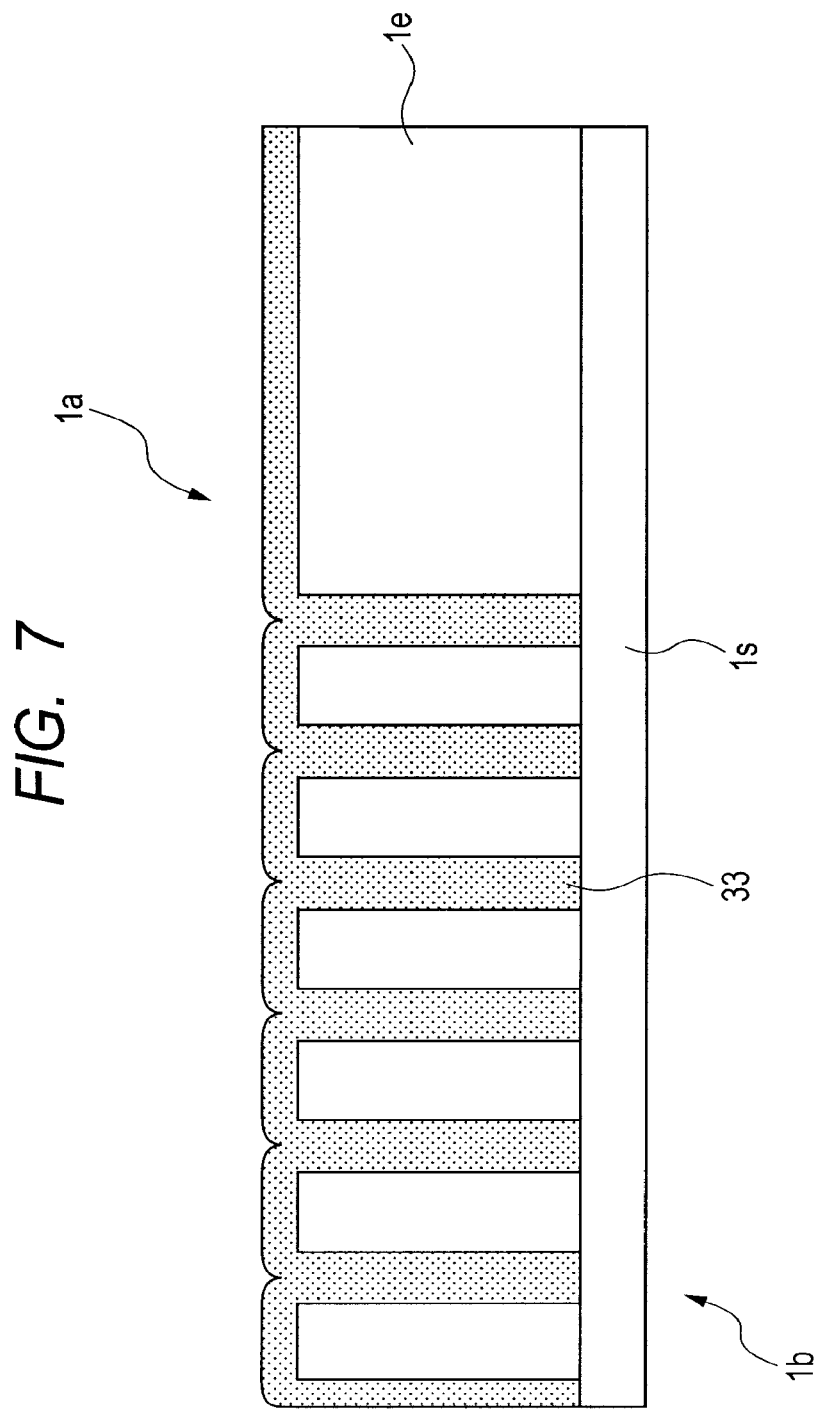
FIG. 7 is a sectional view of the essential part of the device in the wafer process flow of the semiconductor device manufacturing method (at the step of forming a P type buried epitaxial layer)
Figure 8:
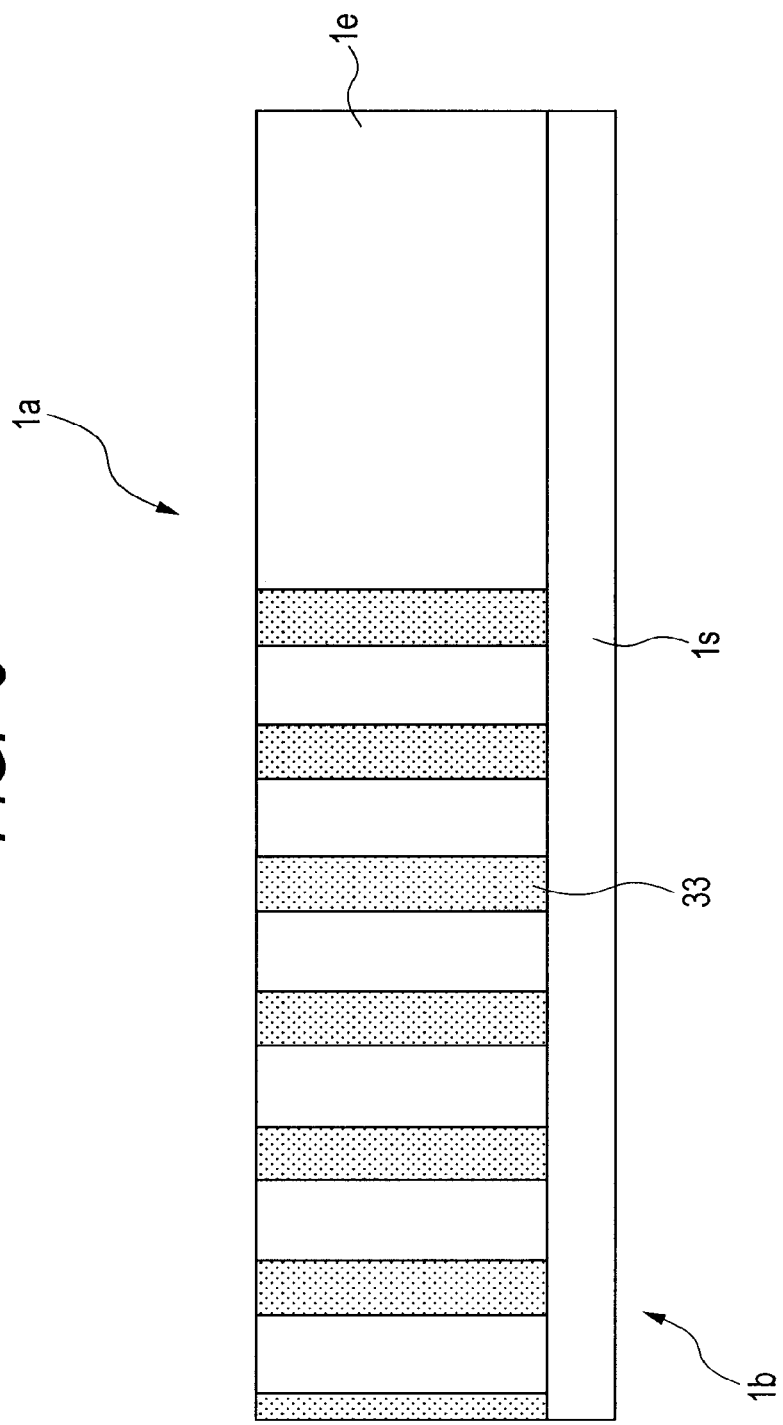
FIG. 8 is a sectional view of the essential part of the device in the wafer process flow of the semiconductor device manufacturing method (at the step of planarizing the P type buried epitaxial layer by CMP)
Figure 9:
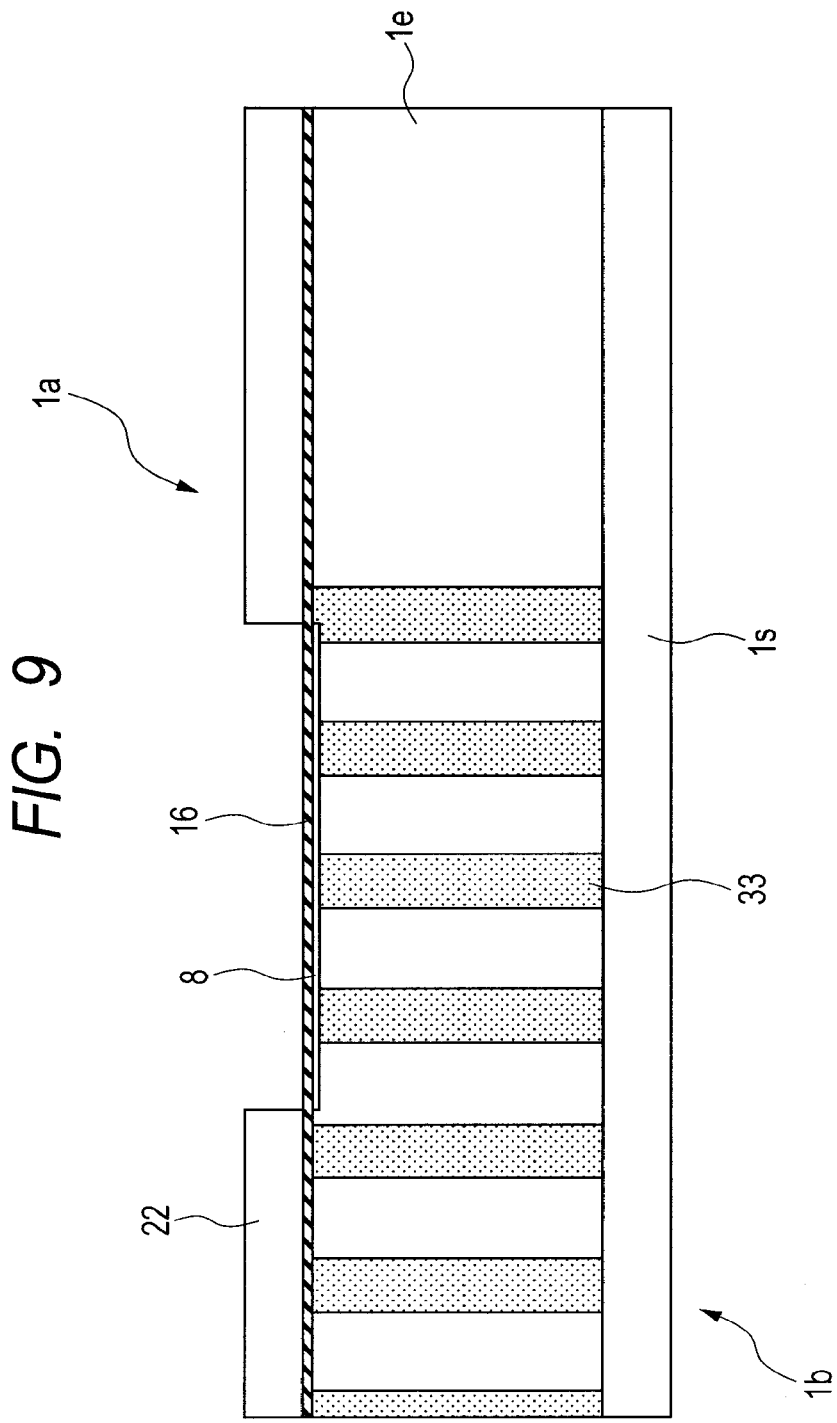
FIG. 9 is a sectional view of the essential part of the device in the wafer process flow of the semiconductor device manufacturing method (at the step of introducing a P− type resurf region)
Figure 10:
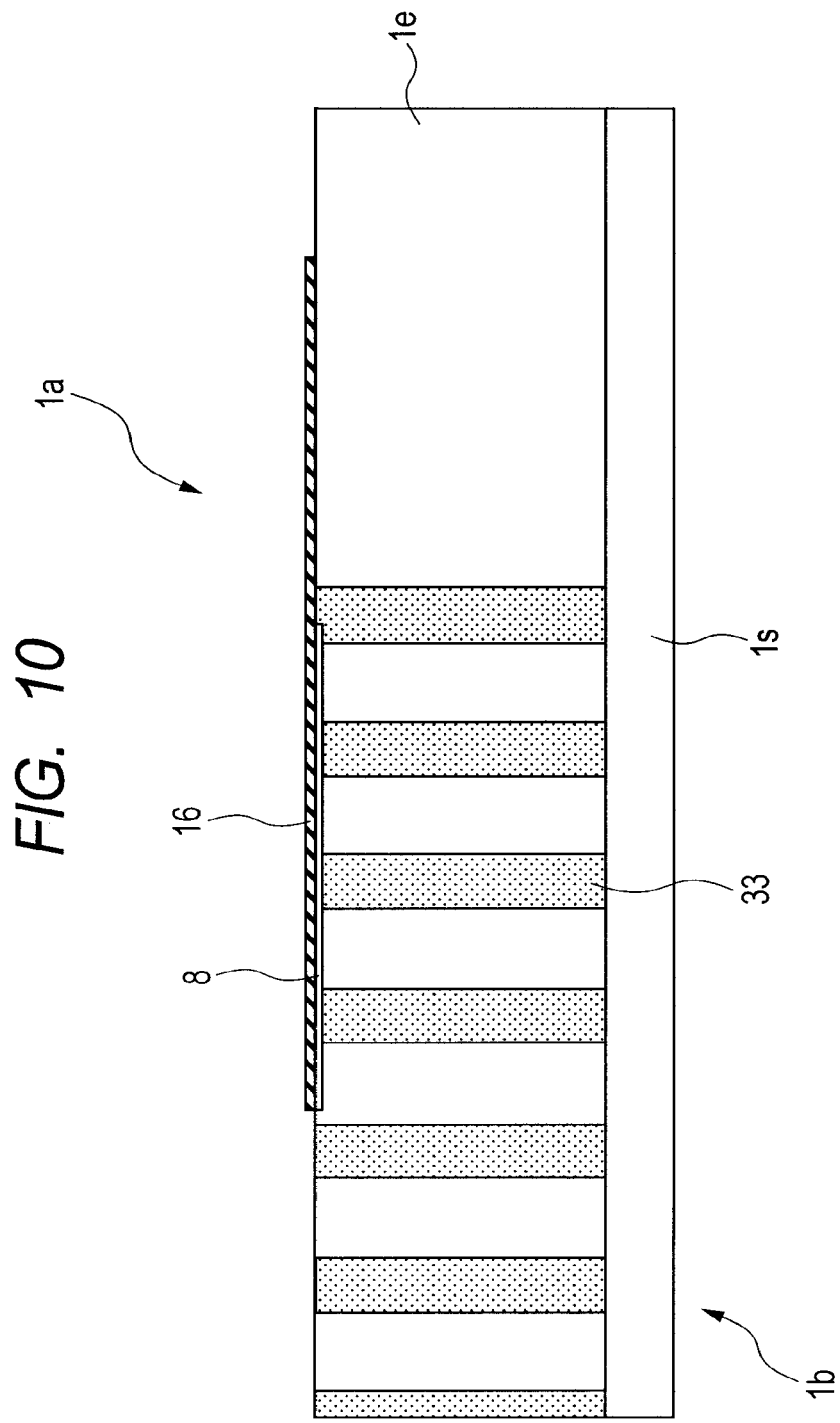
FIG. 10 is a sectional view of the essential part of the device in the wafer process flow of the semiconductor device manufacturing method (at the step of removing the resist film for introducing the P− type resurf region)
Figure 11:
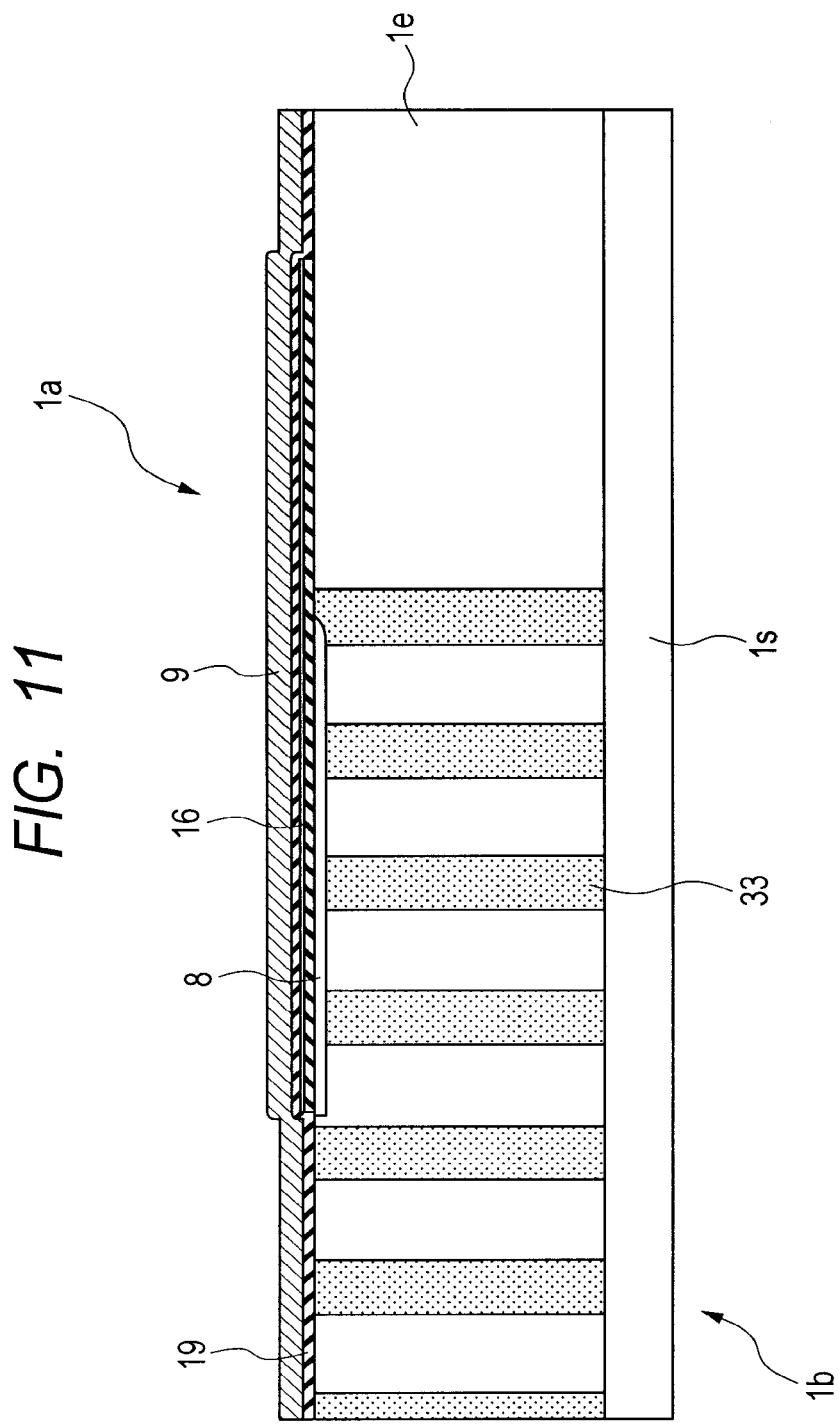
FIG. 11 is a sectional view of the essential part of the device in the wafer process flow of the semiconductor device manufacturing method (at the step of forming a gate polysilicon film)
Figure 12:
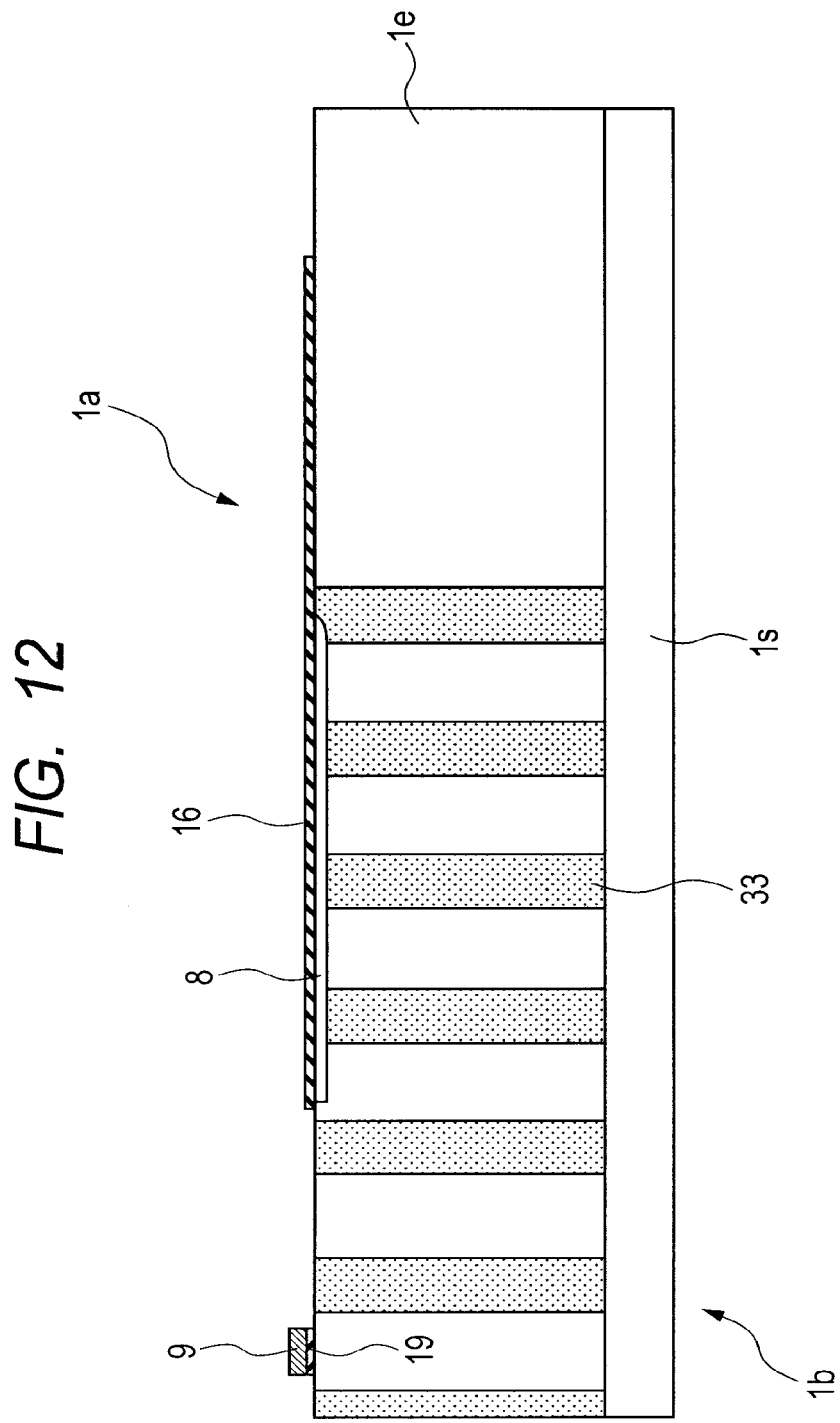
FIG. 12 is a sectional view of the essential part of the device in the wafer process flow of the semiconductor device manufacturing method (at the step of patterning a gate electrode)
Figure 13:
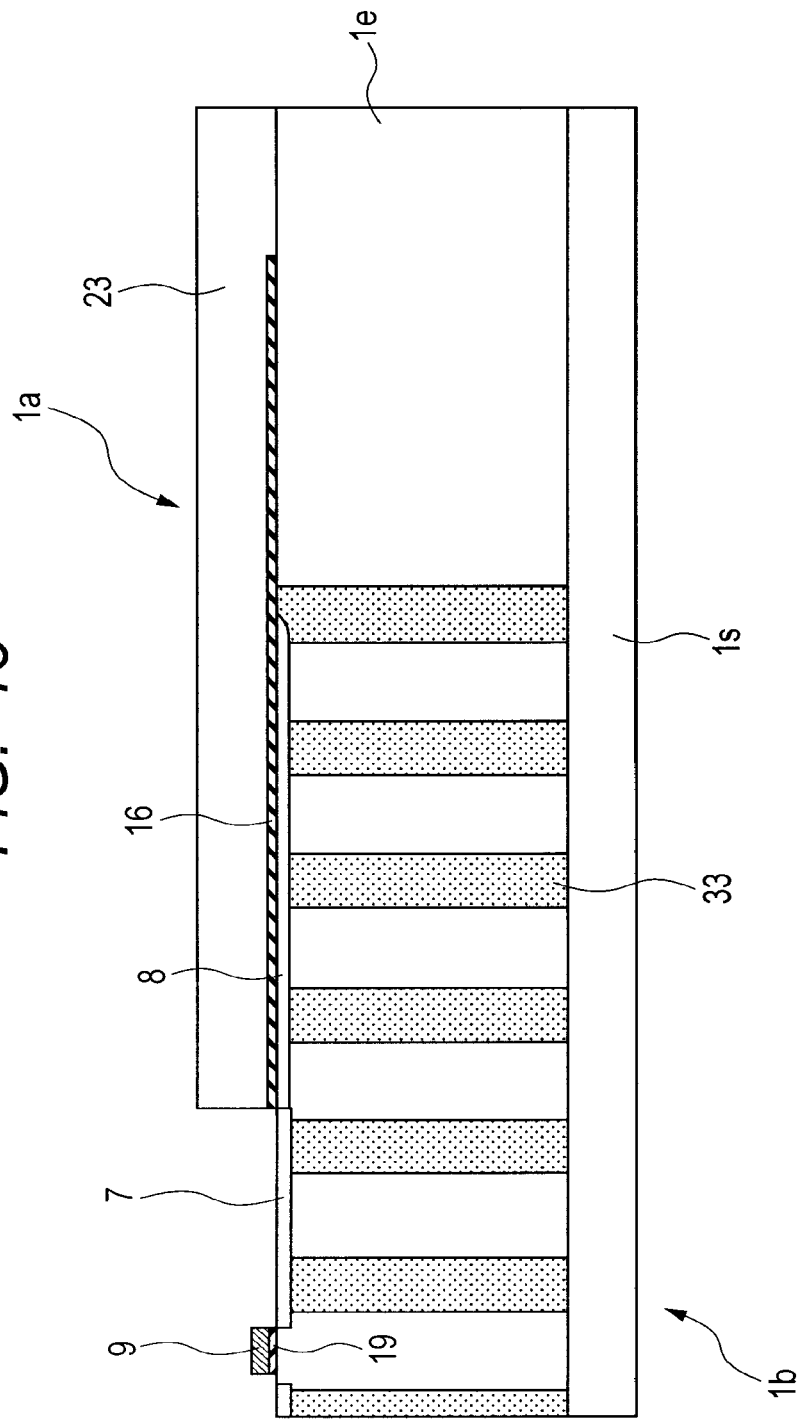
FIG. 13 is a sectional view of the essential part of the device in the wafer process flow of the semiconductor device manufacturing method (at the step of introducing a P type well region)
Figure 14:
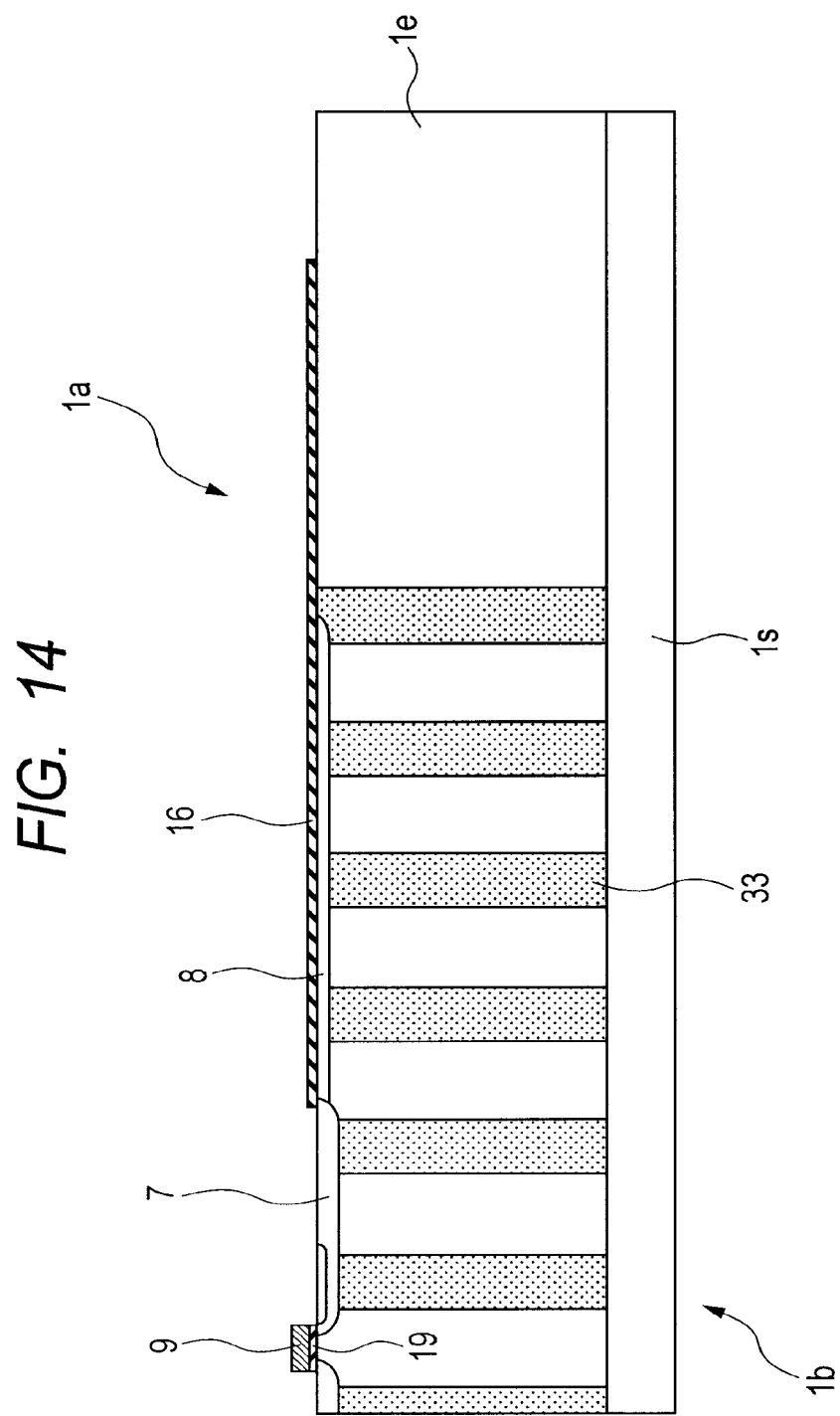
FIG. 14 is a sectional view of the essential part of the device in the wafer process flow of the semiconductor device manufacturing method (at the step of removing the resist film for introducing the P type well region)
Figure 15:
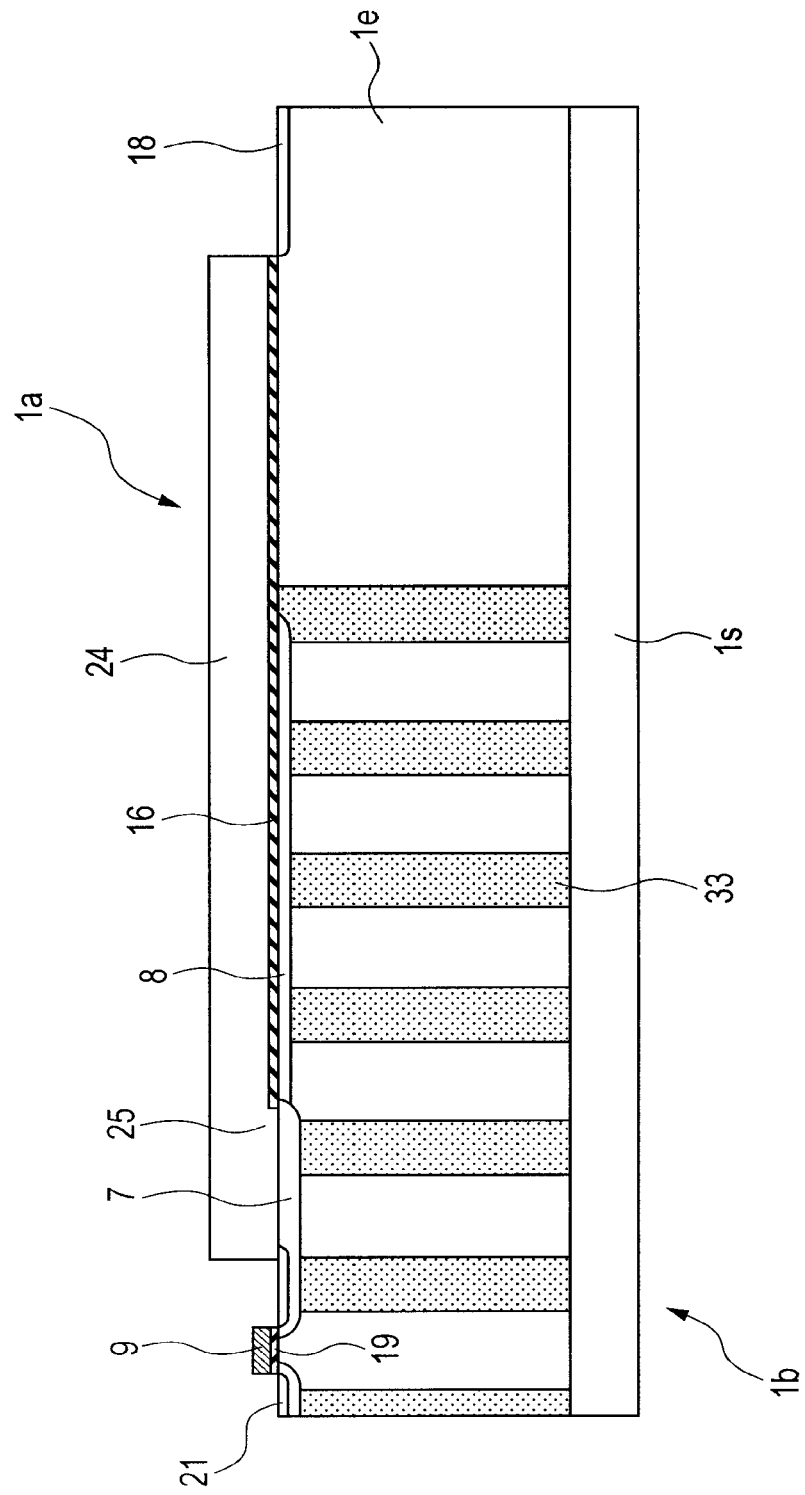
FIG. 15 is a sectional view of the essential part of the device in the wafer process flow of the semiconductor device manufacturing method (at the step of introducing an N+ source region)
Figure 16:
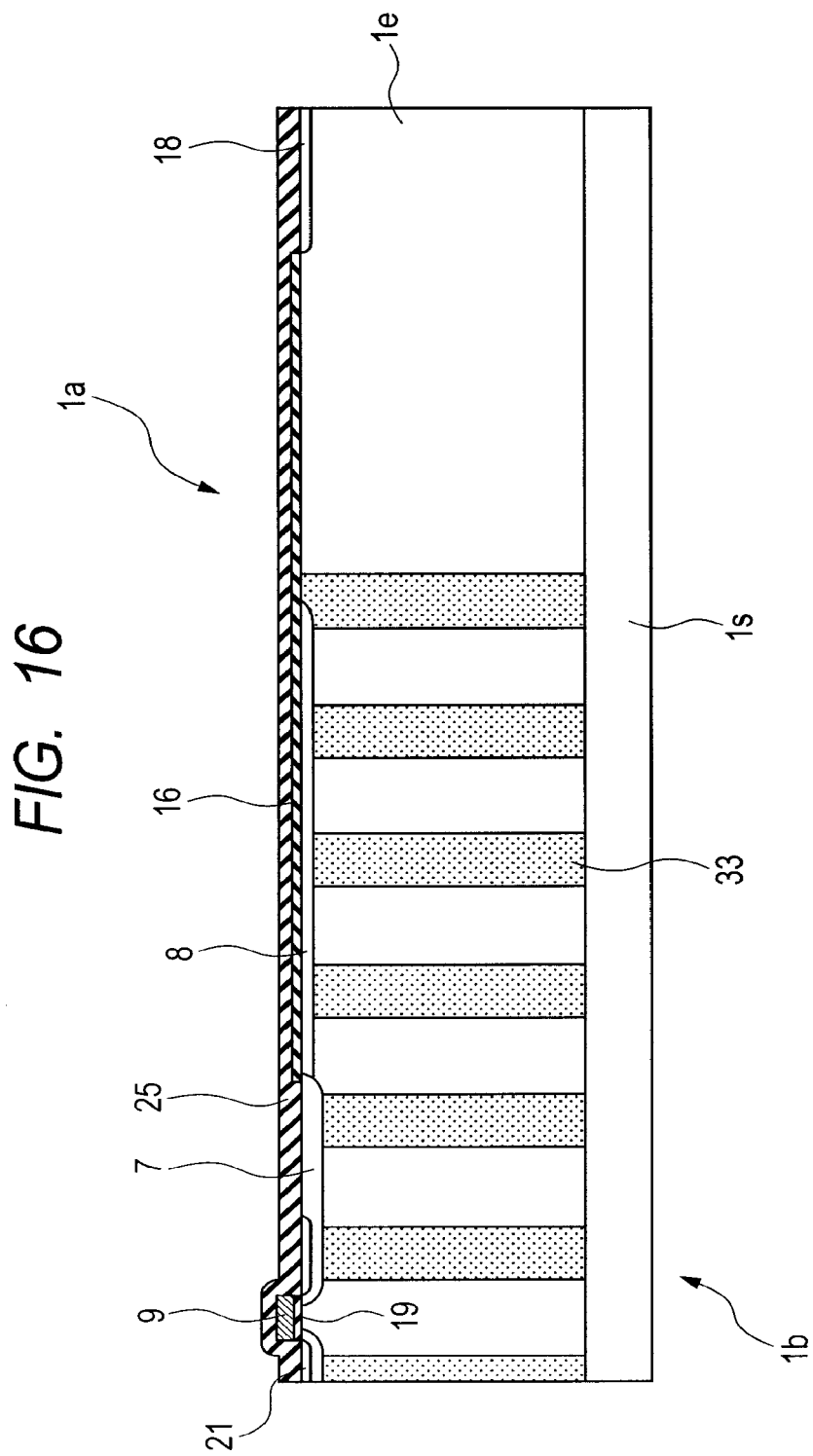
FIG. 16 is a sectional view of the essential part of the device in the wafer process flow of the semiconductor device manufacturing method (at the step of making an interlayer insulating film)
Figure 17:
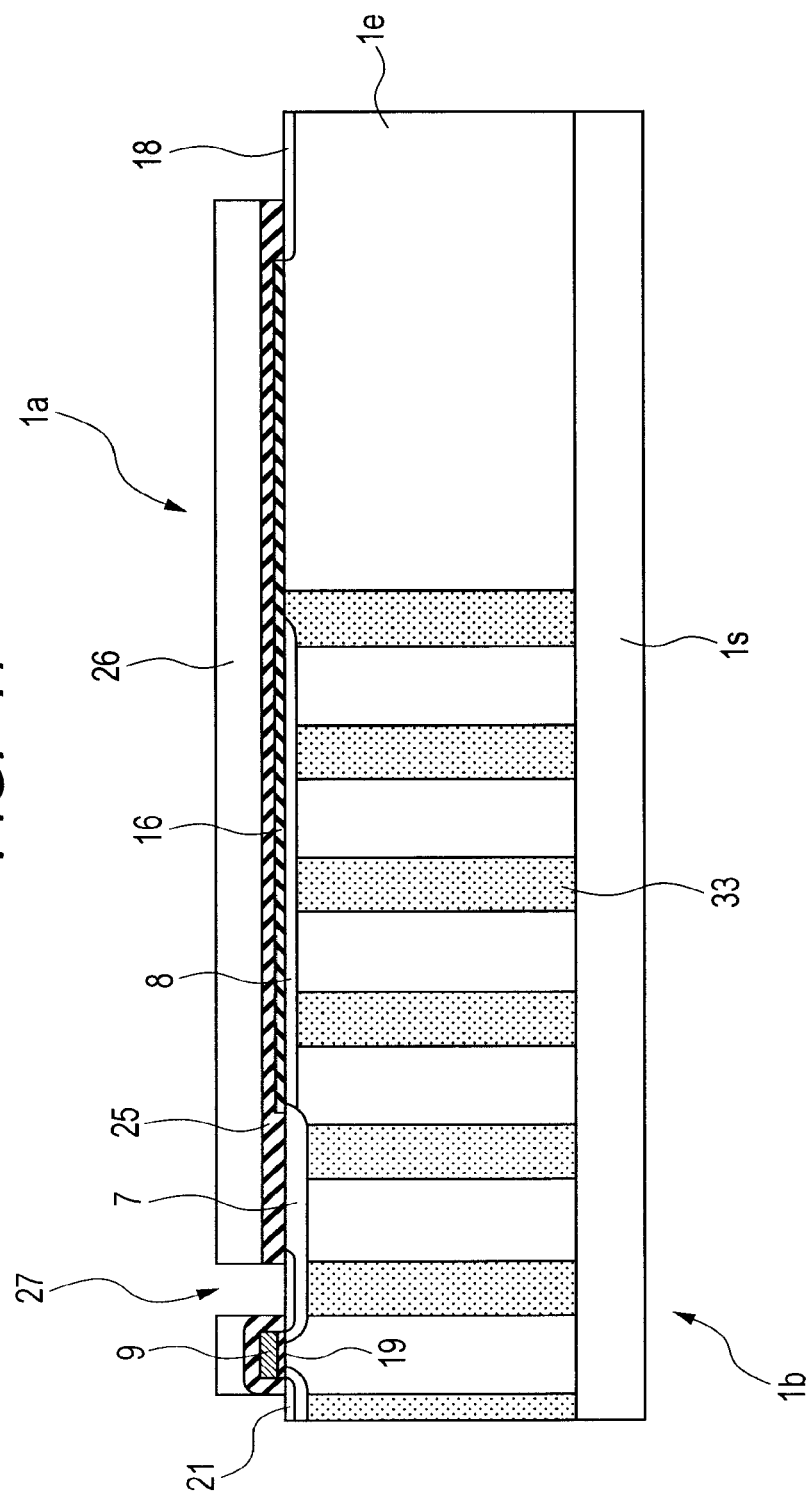
FIG. 17 is a sectional view of the essential part of the device in the wafer process flow of the semiconductor device manufacturing method (at the step of making a source contact hole)
Figure 18:
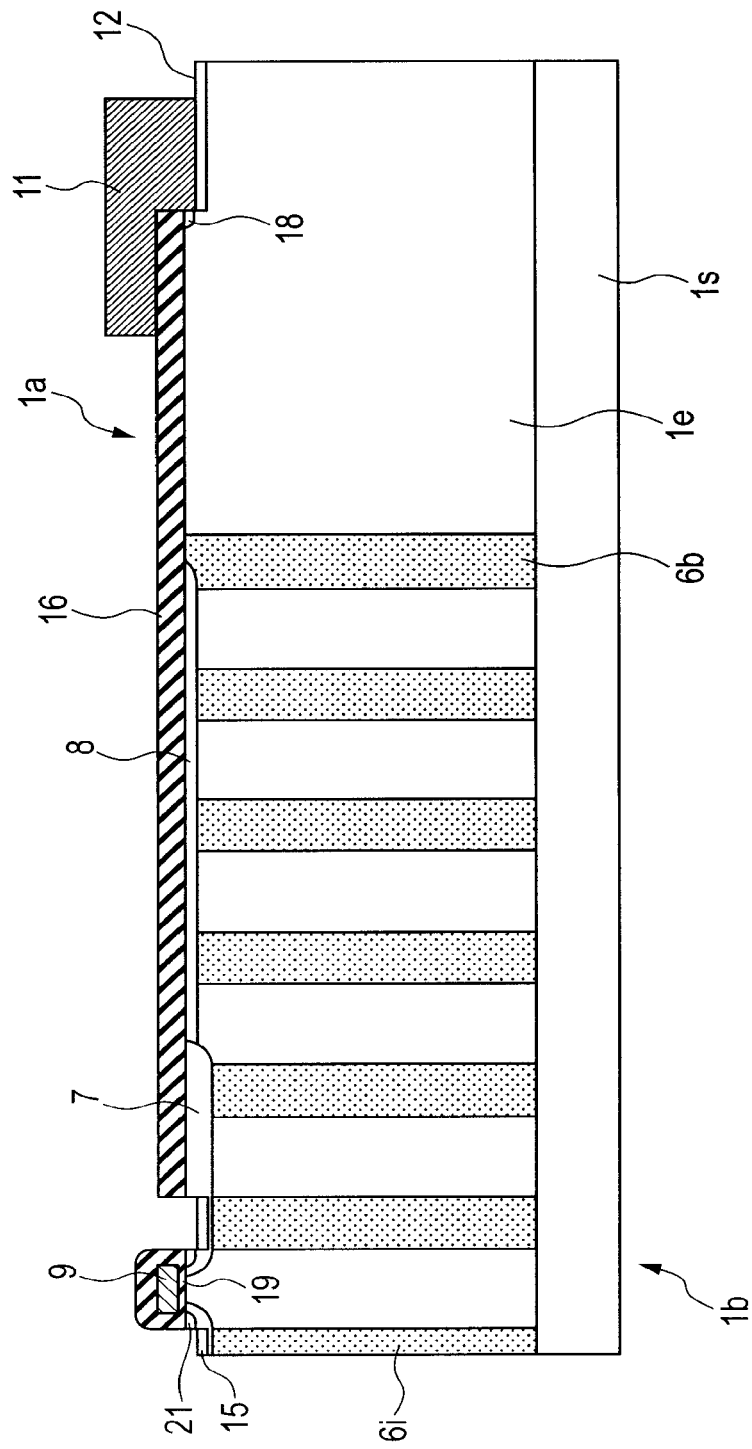
FIG. 18 is a sectional view of the essential part of the device in the wafer process flow of the semiconductor device manufacturing method (at the step of making a P+ contact in the P type well region)

FIG. 5 is a sectional view of an essential part of the device in a wafer process flow of the method for manufacturing a semiconductor device according to the first embodiment of the invention (at the step of patterning a hard mask film for the formation of trenches for P type columns). FIG. 6 is a sectional view of the essential part of the device in the wafer process flow of the semiconductor device manufacturing method (at the step of forming trenches for P type columns). FIG. 7 is a sectional view of the essential part of the device in the wafer process flow of the semiconductor device manufacturing method (at the step of forming a P type buried epitaxial layer). FIG. 8 is a sectional view of the essential part of the device in the wafer process flow of the semiconductor device manufacturing method (at the step of planarization for the P type buried epitaxial layer). FIG. 9 is a sectional view of the essential part of the device in the wafer process flow of the semiconductor device manufacturing method (at the step of introducing a P− type resurf region). FIG. 10 is a sectional view of the essential part of the device in the wafer process flow of the semiconductor device manufacturing method (at the step of removing the resist film for introducing the P− type resurf region). FIG. 11 is a sectional view of the essential part of the device in the wafer process flow of the semiconductor device manufacturing method (at the step of forming a gate polysilicon film). FIG. 12 is a sectional view of the essential part of the device in the wafer process flow of the semiconductor device manufacturing method (at the step of patterning a gate electrode). FIG. 13 is a sectional view of the essential part of the device in the wafer process flow of the semiconductor device manufacturing method (at the step of introducing a P type well region). FIG. 14 is a sectional view of the essential part of the device in the wafer process flow of the semiconductor device manufacturing method (at the step of removing the resist film for introducing the P type well region). FIG. 15 is a sectional view of the essential part of the device in the wafer process flow of the semiconductor device manufacturing method (at the step of introducing an N+ source region). FIG. 16 is a sectional view of the essential part of the device in the wafer process flow of the semiconductor device manufacturing method (at the step of making an interlayer insulating film). FIG. 17 is a sectional view of the essential part of the device in the wafer process flow of the semiconductor device manufacturing method (at the step of making a source contact hole). FIG. 18 is a sectional view of the essential part of the device in the wafer process flow of the semiconductor device manufacturing method (at the step of making a P+ contact in the P type well region). Referring to these drawings, the important steps of the method for manufacturing a semiconductor device according to the first embodiment of the invention are described next.

As shown in FIG. 5, a semiconductor wafer 1 is prepared, in which, for example, a phosphor-doped N epitaxial layer 1e with a thickness of about 45 micrometers (drift region with a doping concentration in the order of $10^{15}/cm^3$) is formed over an N+ silicon single-crystal substrate is (the wafer diameter is, for example, 200; however, instead it may be 150, 300, or 450) doped with antimony (for example, in the order of $10^{18}$ to $10^{19}/cm^3$). A hard mask film 31, for example, of P-TEOS (Plasma-Tetraethylorthosilicate) for the formation of trenches for P type columns is formed over the device surface 1a (main surface opposite to the back surface 1b) of the semiconductor wafer 1.

Then, as shown in FIG. 6, trenches 32 for P type columns are formed by dry-etching the N epitaxial layer 1e, etc. using the hard mask film 31 for the formation of trenches for P type columns as a mask. Then, the hard mask film 31, which has become useless, is removed.

Then, as shown in FIG. 7, a P type buried epitaxial layer 33 (for example, with a concentration in the order of $10^{15}/cm^3$) is formed in the trenches 32 for P type columns by buried epitaxial growth.

Then, as shown in FIG. 8, the P type buried epitaxial layer 33 lying outside the trenches 32 is removed by a planarization process, for example, CMP (Chemical Mechanical Polishing) and the surface 1a of the semiconductor wafer 1 is planarized. Here, not only the trench fill technique but also the multi-epitaxial technique may be used to form the super junction structure as shown in FIG. 8.

Then, as shown in FIG. 9, a silicon oxide film 16 is formed almost all over the surface 1a of the semiconductor wafer 1 by thermal oxidation and a resist film 22 for introducing a P− type resurf region is formed over it by lithography. Then, a P− type surface resurf region 8 is introduced by implanting ions (for example, boron) using the resist film 22 as a mask. Then, as shown in FIG. 10, the resist film 22, which has become useless, is all removed.

Then, as shown in FIG. 11, a gate oxide film 19 is formed over the surface 1a of the semiconductor wafer 1 by thermal oxidation (for example, wet oxidation at 950 degrees Celsius) and a gate polysilicon film 9 is formed over it, for example, by low-pressure CVD (Chemical Vapor Deposition). For wafer cleaning before gate oxidation, wet cleaning can be done using a first cleaning solution containing ammonia, hydrogen peroxide, and deionized water in the volume ratio of 1:1:5 and a second cleaning solution containing hydrochloric acid, hydrogen peroxide, and deionized water in the volume ratio of 1:1:6.

Then, as shown in FIG. 12, the gate electrode 9 is patterned by dry etching.

Then, as shown in FIG. 13, a resist film 23 for introducing a P type well region is formed by lithography. Then, a P− type well region 7 (P type body region) is introduced (for example, at a concentration in the order of $10^{17}/cm^3$) by implanting ions using the resist film 23 as a mask. Then, as shown in FIG. 14, the resist film 23, which has become useless, is all removed.

Then, as shown in FIG. 15, a resist film 24 for introducing an N+ source region is formed by lithography and by implanting ions (for example, arsenic) using the resist film 24 as a mask, an N+ source region 21 and a semiconductor region 18 corresponding to the N+ channel stopper region at the chip edge are introduced (for example, at a concentration in the order of $10^{20}/cm^3$). Then, the resist film 24, which has become useless, is all removed.

Then, as shown in FIG. 16, a PSG (Phospho-Silicate-Glass) film 25 (interlayer insulating film) is deposited virtually all over the surface 1a of the semiconductor wafer 1 by CVD, etc (alternatively an SOG film may be laid over it and planarized).

Then, as shown in FIG. 17, a resist film 26 for making a source contact hole is formed over the surface 1a of the semiconductor device 1 and by dry etching using it as a mask, a source contact hole 27 is made. Then, the resist film 26, which has become useless, is all removed.

Then, as shown in FIG. 18, after the silicon substrate is etched, P+ body contact regions 12 and 15 are introduced by implanting ions (for example, $BF_2$) (for example, at a concentration in the order of $10^{19}/cm^3$). Further, as shown in FIGS. 3 and 4 and other figures (FIGS. 20 to 22, 26 to 29, 31, 32, 34, and 35), an aluminum metal layer is deposited through a barrier metal film of TiW or other material by sputtering, etc and pattering is performed to make a metal source electrode 14, guard ring electrode 11, etc.

3. Description of the Device Structure (3D Resurf Structure) of a Power MOSFET as a Semiconductor Device According to a Second Embodiment of the Invention (See Mainly FIGS. 19 to 21)

In the resurf structure described in this section, P type columns extend perpendicularly to corresponding sides of the cell region in the cell peripheral region, so in terms of the degree of freedom in electric field directions in the depletion layer extending to the P– type surface layer, the structure has a 3-degree-of-freedom, specifically the direction parallel to a corresponding side of the cell region, the direction from the back surface of the substrate to its front surface, and the direction from the chip edge toward the inside of the device main surface; thus this type of resurf structure is called a 3D resurf structure. The basic configuration of the device is almost the same as that of the device described in Section 1 and basically, only aspects which are different from it will be described in this and subsequent sections.

Figure 19:
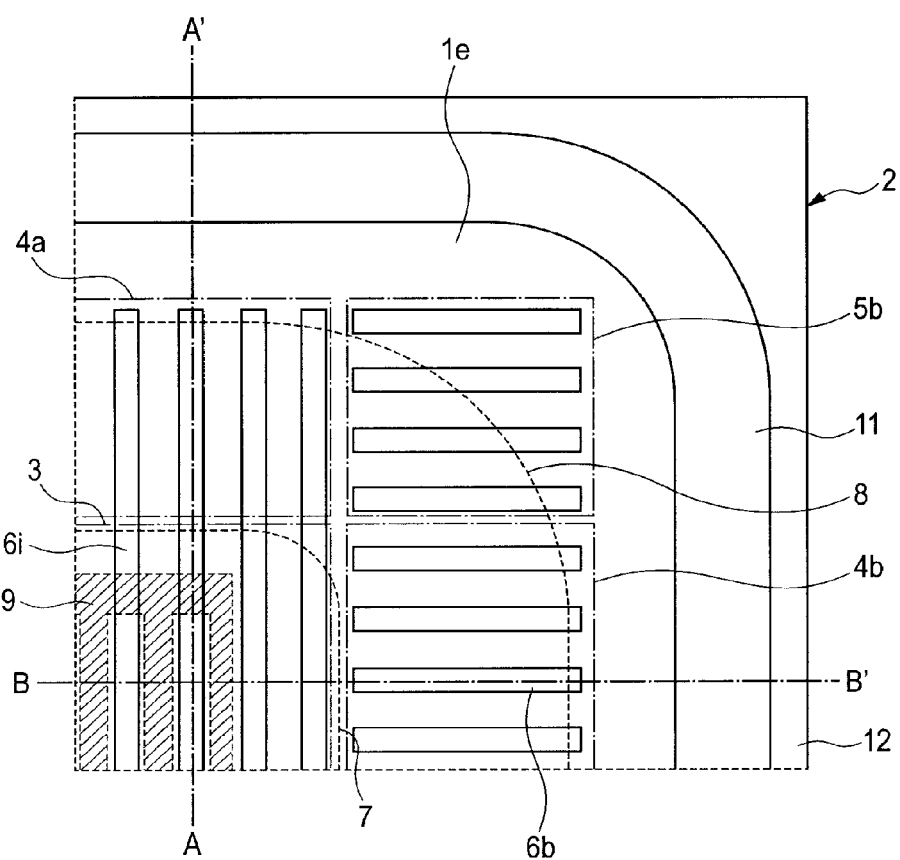
FIG. 19 is an enlarged plan view of the layout of a chip corner CR including the right upper end of the cell region in the device structure (3D resurf structure) of the power MOSFET as a semiconductor device according to a second embodiment of the invention.
Figure 20:
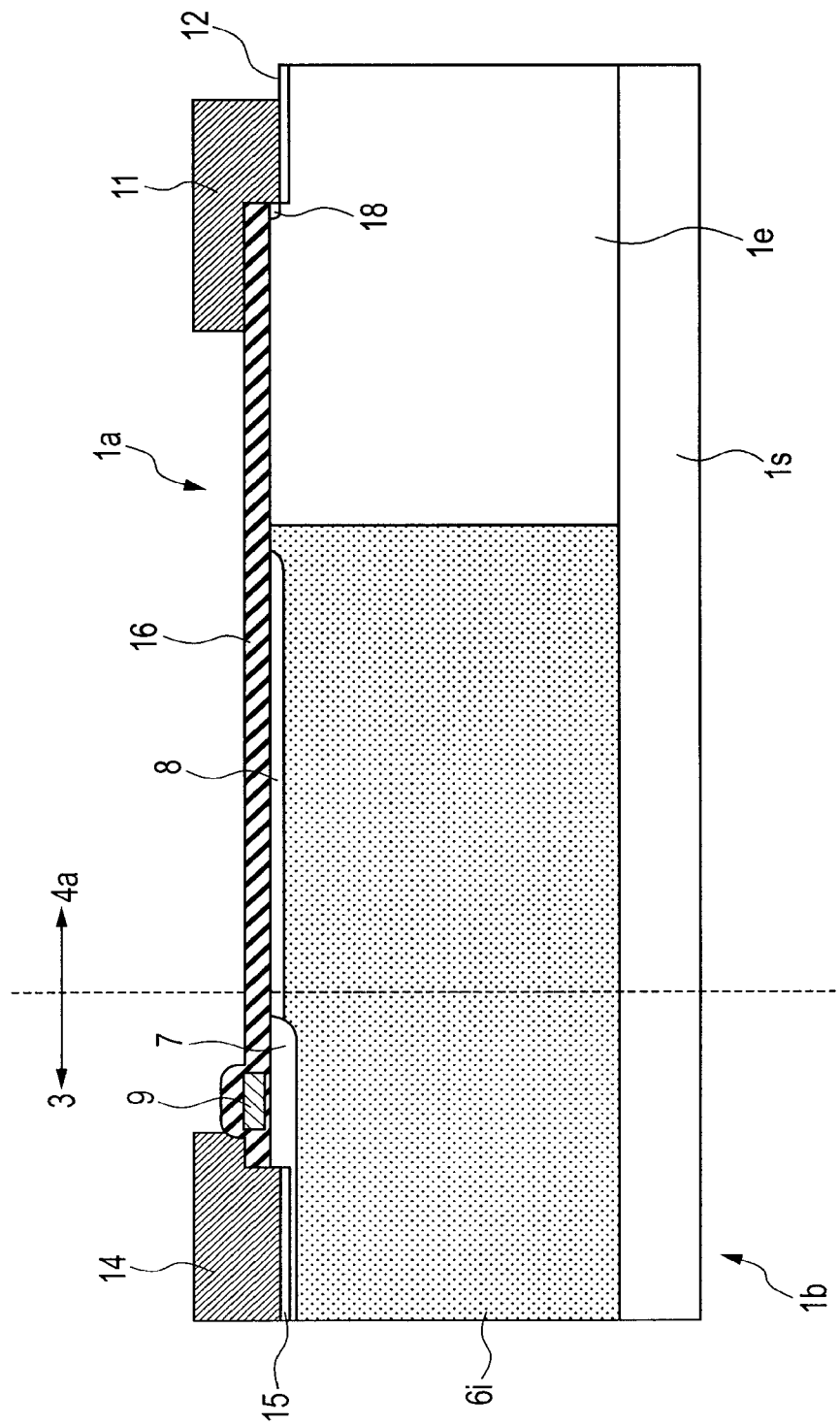
FIG. 20 is a sectional view of an essential part of the device structure (3D resurf structure) of the power MOSFET, taken along the line A-A' of FIG. 19.
Figure 21:
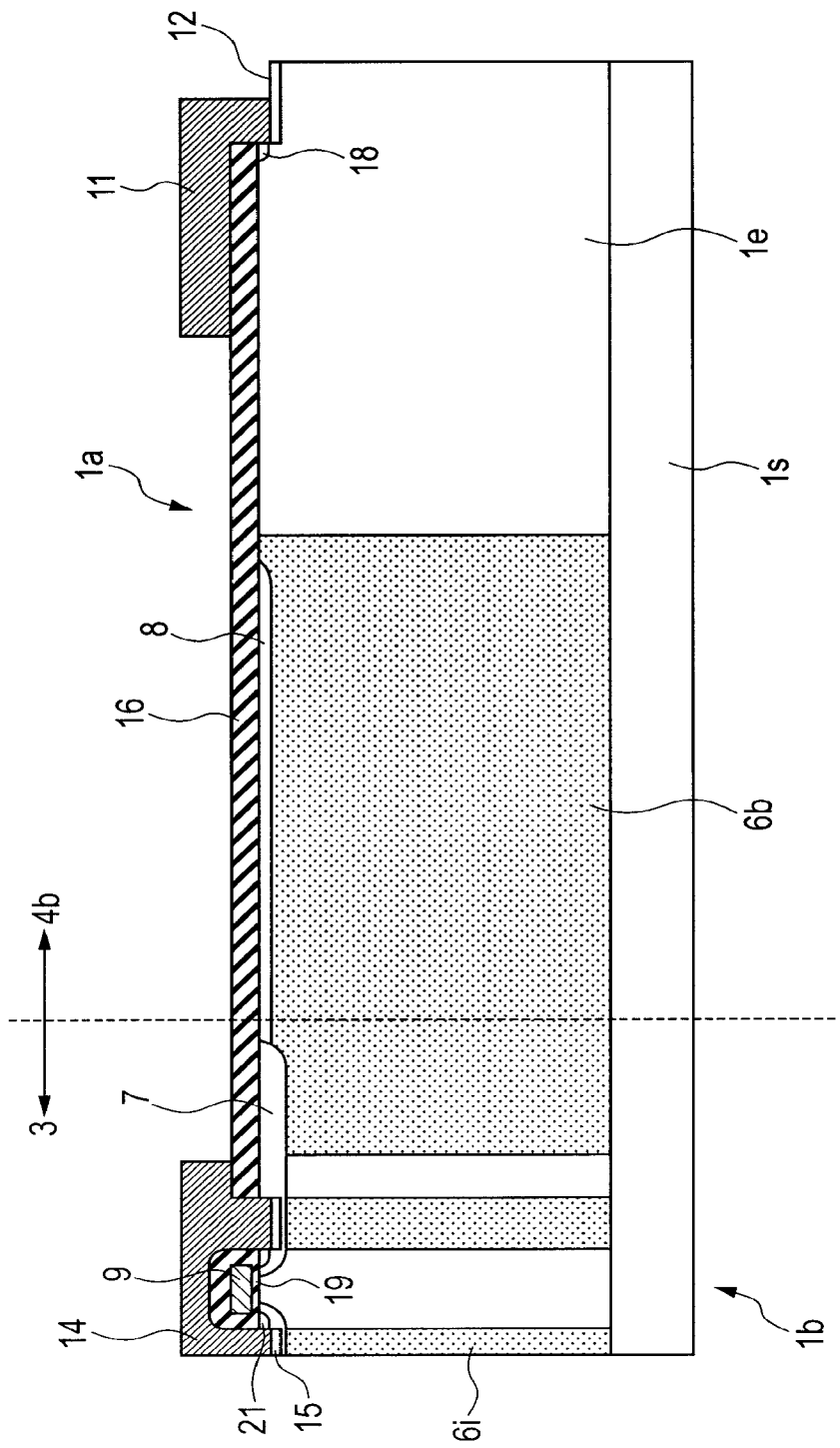
FIG. 21 is a sectional view of the essential part of the device structure (3D resurf structure) of the power MOSFET, taken along the line B-B' of FIG. 19.

FIG. 19 is an enlarged plan view of the layout of a chip corner CR including the right upper end of the cell region in the device structure (3D resurf structure) of the power MOSFET as a semiconductor device according to the second embodiment of the invention. FIG. 20 is a sectional view of an essential part of the device structure (3D resurf structure) of the power MOSFET, taken along the line A-A' of FIG. 19. FIG. 21 is a sectional view of the essential part of the device structure of the power MOSFET, taken along the line B-B' of FIG. 19. Referring to these drawings, the device structure (3D resurf structure) of the power MOSFET as a semiconductor device according to the second embodiment of the invention is described below.

As shown in FIGS. 19 to 21, when the semiconductor chip 2 (chip region) is viewed from the device main surface 1a (opposite to the back surface 1b of the chip 2) side, it includes a virtually square or rectangular cell region 3, a ring-shaped cell peripheral region surrounding it, and a ring-shaped chip end region outside it as a chip end. This cell region 3 includes a linear repetitive gate electrode 9 as a key part of the power MOSFET, P type well region 7 (P type body region) provided in a surface region of an N epitaxial layer 1e (drift region), and super junction structure comprised of many P type columns 6i (namely, a first super junction structure having a first orientation). The cell peripheral region includes peripheral side regions 4a and 4b (and 4c and 4d) adjacent to the four sides of the cell region 3 and peripheral corner regions 5a and 5b (and 5c and 5d) corresponding to the corners of the chip 2 between them. In order to prevent formation of an undesired channel at the chip end, the chip end region has a ring-shaped N+ channel stopper 18 and a ring-shaped guard ring electrode 11 (aluminum metal electrode) coupled to it.

In the cell peripheral region, a plurality of P type columns 6b like P type columns 6i are provided in the N epitaxial layer 1e (drift region) of the peripheral side regions 4b and peripheral corner region 5b (namely, a fourth and a fifth super junction structure having an orientation perpendicular to the first orientation). Another part of the cell peripheral region, namely the N epitaxial layer 1e (drift region) of the peripheral side region 4a, has a plurality of P type columns as extensions of the P type columns 6i of the cell region (namely, a second and a third super junction structure having an orientation which is almost the same as the first orientation).

FIG. 20 is a sectional view taken along the line A-A' of FIG. 19. As shown in FIG. 20, an N epitaxial layer 1e (drift region) lies over an N+ silicon single-crystal substrate is and P type columns 6i penetrate this layer vertically. An N+ contact region 15 is provided in the P type well region 7 (P type body region) on the surface of the epitaxial layer 1e and coupled to a metal source electrode 14 through barrier metal, etc. The P type well region 7 has a P– type surface resurf region 8 with a lower concentration than its concentration as an extension, extending, for example, up to the vicinity of the outermost P type column. A field insulating film, etc 16 is provided on the surface of the N epitaxial layer 1e and the gate electrode 9 (gate polysilicon film), etc lies in it. The chip end region includes, in addition to the N+ channel stopper 18 and the ring-shaped guard ring electrode 11 coupled to it, a semiconductor region 12 corresponding to the P+ body contact region at the chip edge, which is formed simultaneously with impurity doping into the cell region 3 and functions as a channel stopper in combination with the N+ channel stopper 18, guard ring electrode 11 and so on.

FIG. 21 is a sectional view taken along the line B-B' of FIG. 19. As shown in FIG. 21, a gate insulating film 19 lies under the gate polysilicon film 9 and an N+ source region 21 is provided on the surface of the P type body region 7 on both sides of the gate electrode 9. P type columns 6b penetrate the drift region 1e vertically.

4. Description of a variation of the surface resurf layer of the device structure of each of power MOSFETs according to embodiments of the invention (see mainly FIG. 22).

The surface resurf layer described in each section is effective, when combined with other resurf structures, in preventing the breakdown voltage from dropping, though it is not essential for each example. Obviously the divided surface resurf layer described in this section is applicable to various surface resurf layers described in connection with other examples.

Figure 22:
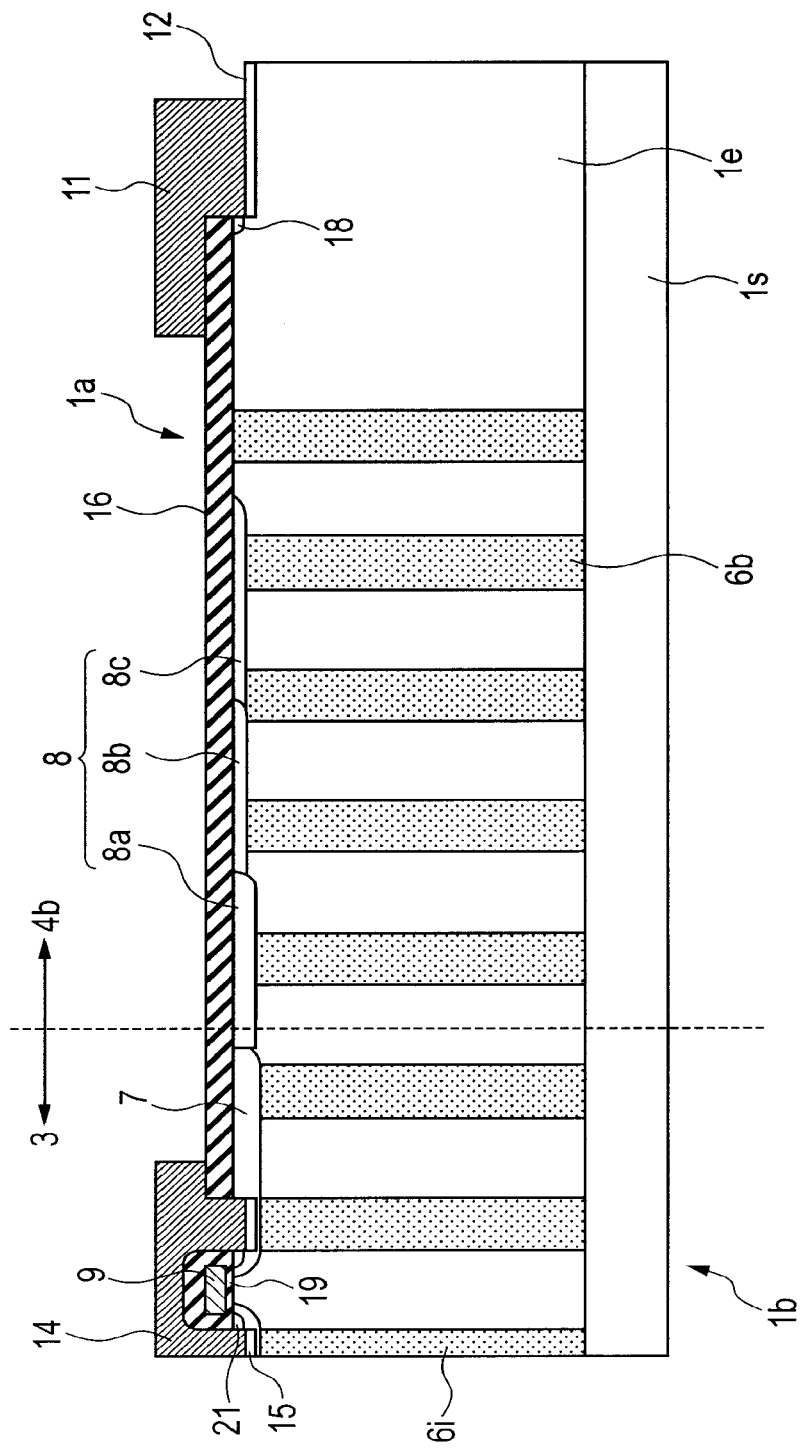
FIG. 22 is a schematic sectional view of a device essential part virtually corresponding to FIGS. 4, 21, etc which illustrates a variation (step-like) of the P− surface resurf layer of the device structure of each of power MOSFETs according to embodiments of the invention.

FIG. 22 is a schematic sectional view of a device essential part, virtually corresponding to FIGS. 4, 21, etc, which illustrates a variation (step-like) of the P– surface resurf layer of the device structure of each of power MOSFETs according to embodiments of the invention. Referring to FIG. 22, the variation of the surface resurf layer of the device structure of each of power MOSFETs according to embodiments of the invention is explained below.

As shown in FIG. 22, this example is characterized in that the P– type surface resurf region 8 is divided into a plurality of regions 8a, 8b, and 8c (divisional P– type resurf regions). Among the divisional P– type resurf regions 8a, 8b, and 8c, the region 8a, located near a chip end at which electric field concentration easily occurs, has a higher concentration that the regions 8b and 8c. It is also possible that the diffusion layer depth of the P– resurf layer decreases toward the direction from the chip end to the chip edge. This offers an advantageous effect that a high breakdown voltage is maintained by a smaller area than with a single or non-divided surface resurf region.

5. Description of a Variation of the Super Junction Planar Structure of a Peripheral Corner Region in the Device Structure (2D Resurf Structure) of a Power MOSFET as a Semiconductor Device According to the First Embodiment of the Invention (See Mainly FIGS. 23 to 25).

The revised corner structure described in this section is intended to prevent a relative breakdown voltage drop due to imperfect symmetry in the super junction structure of the peripheral corner region and is more needed for high breakdown voltages though it is not essential. This revised structure is advantageous in that a relatively high breakdown voltage is achieved in a relatively small cell peripheral region. It is particularly effective for the 2D resurf structure because the 2D resurf structure requires a larger cell peripheral region area in order to achieve the same high breakdown voltage as the 3D resurf structure (because the degree of spatial freedom is lower).

Figure 23:
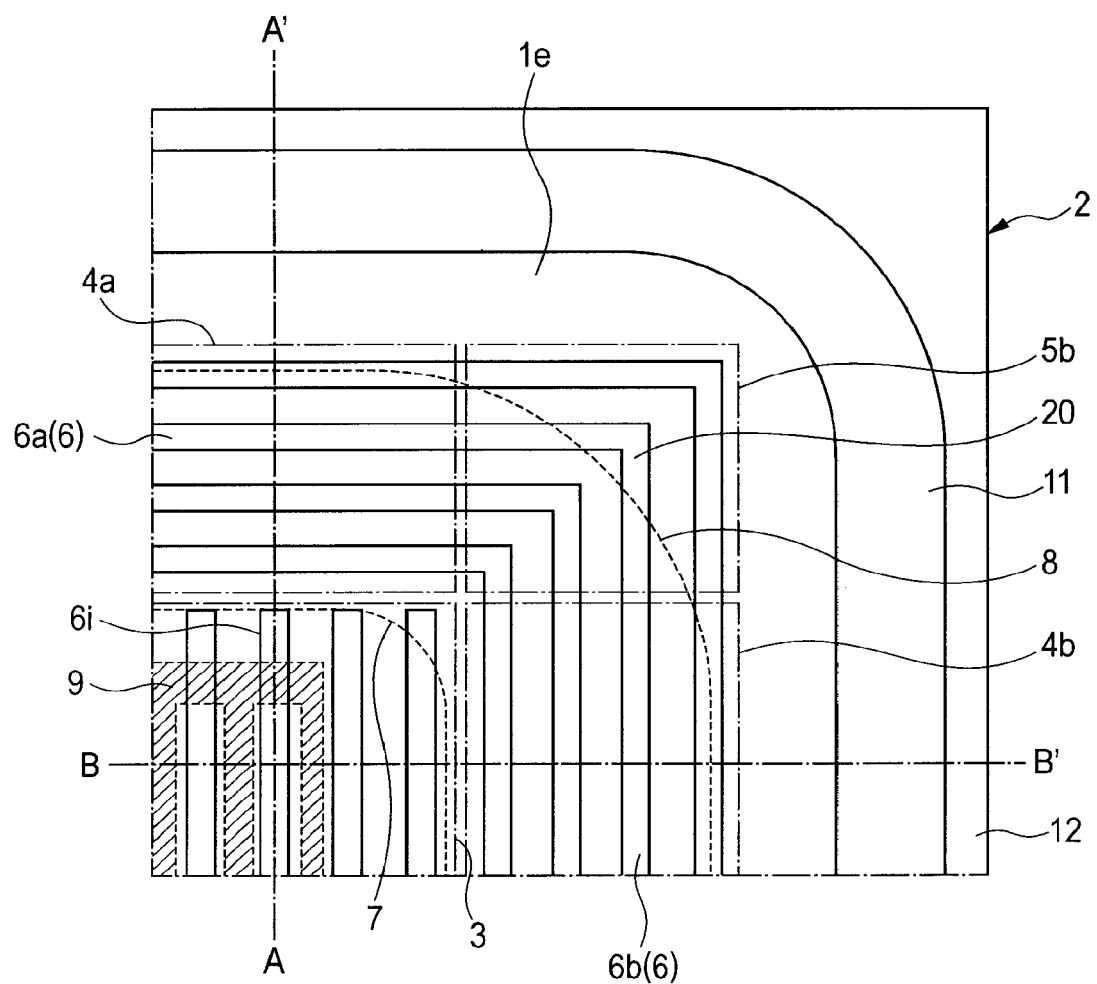
FIG. 23 is an enlarged plan view of the layout of a chip corner CR including the right upper end of the cell region, corresponding to FIG. 2, etc, in a variation (simple bend type) of the super junction planar structure of a peripheral corner region in the device structure (2D resurf structure) of a power MOSFET as a semiconductor device according to the first embodiment of the invention.
Figure 24:
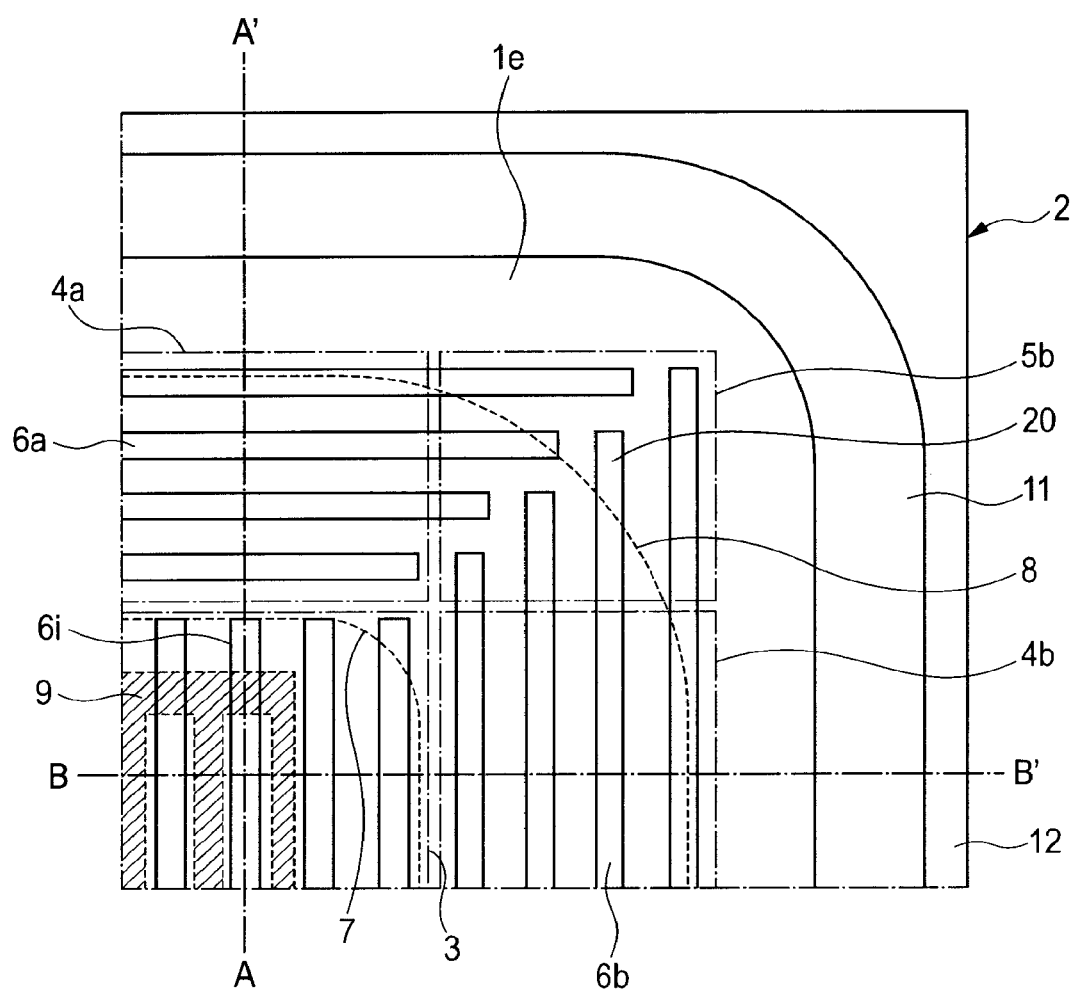
FIG. 24 is an enlarged plan view of the layout of a chip corner CR including the right upper end of the cell region, corresponding to FIG. 2, etc, in a variation (bend separation type) of the super junction planar structure of a peripheral corner region in the device structure (2D resurf structure) of a power MOSFET as a semiconductor device according to the first embodiment of the invention.
Figure 25:
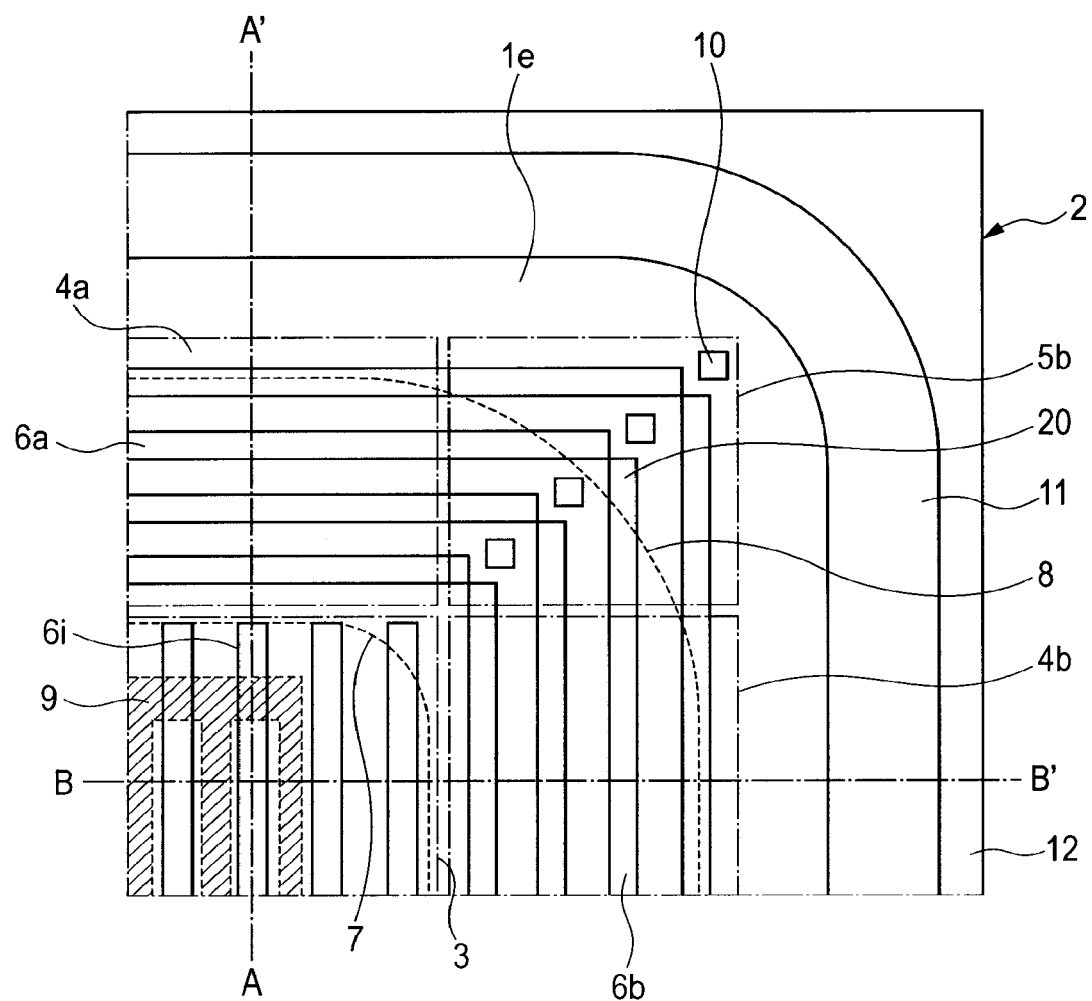
FIG. 25 is an enlarged plan view of the layout of a chip corner CR including the right upper end of the cell region, corresponding to FIG. 2, etc, in a variation (auxiliary P type column type) of the super junction planar structure of a peripheral corner region in the device structure (2D resurf structure) of a power MOSFET as a semiconductor device according to the first embodiment of the invention.

FIG. 23 is an enlarged plan view of the layout of a chip corner CR including the right upper end of the cell region, corresponding to FIG. 2, etc, in a variation (simple bend type) of the super junction planar structure of a peripheral corner region in the device structure (2D resurf structure) of a power MOSFET as a semiconductor device according to the first embodiment of the invention. FIG. 24 is an enlarged plan view of the layout of a chip corner CR including the right upper end of the cell region, corresponding to FIG. 2, etc, in a variation (bend separation type) of the super junction planar structure of a peripheral corner region in the device structure (2D resurf structure) of a power MOSFET as a semiconductor device according to the first embodiment of the invention. FIG. 25 is an enlarged plan view of the layout of a chip corner CR including the right upper end of the cell region, corresponding to FIG. 2, etc, in a variation (auxiliary P type column type) of the super junction planar structure of a peripheral corner region in the device structure (2D resurf structure) of a power MOSFET as a semiconductor device according to the first embodiment of the invention. Referring to these drawings, variations of the super junction planar structure of the peripheral corner in the device structure (2D resurf structure) of a power MOSFET as a semiconductor device according to the first embodiment of the invention is explained below.

FIG. 23 shows the first variation (simple bend type). As shown in FIG. 23, P type columns in the cell peripheral region are connected in the form of a ring unlike FIG. 2. Specifically, P type columns 6a and 6b in peripheral side regions 4a and 4b are connected with each other to form virtually L-shaped columns 20. This structure is very simple and advantageous from the viewpoint of the manufacturing process, though some disruption of charge balance may occur in the vicinity of the bend (there may be an area with excessive P type charge and an area with insufficient P type charge in the vicinity of the bend). FIGS. 24 and 25 show improved versions of this variation.

FIG. 24 shows the second variation (bend separation type). As shown in FIG. 24, P type columns 6a and 6b are separated from each other in the vicinity of the bend unlike FIG. 23. This variation is very simple and advantageous from the viewpoint of the manufacturing process, though there is a tendency toward P type charge insufficiency in the vicinity of the bend.

FIG. 25 shows the third variation (auxiliary P type column type). As shown in FIG. 25, unlike FIG. 23, the bends of P type columns 6a and 6b are cut to produce auxiliary P type columns (auxiliary columns 10) in the peripheral corner region and the auxiliary columns are somewhat shifted along the diagonal line of the chip 2. This maintains charge balance properly.

6. Description of a Field Plate Applied to the Device Structure (2D Resurf Structure) of a Power MOSFET as a Semiconductor Device According to the First Embodiment of the Invention (See Mainly FIGS. 26 and 27).

In the example given here, an outward extension of the source metal electrode is used as a field plate. Alternatively, the field plate may be a floating field ring as described in Sections 8 and 9 which is coupled to the metal electrode and extended outward in the form of an insulating film. Obviously the field plate described here may be applied to the examples described in Sections 1, 4, 5, and 8.

Figure 26:
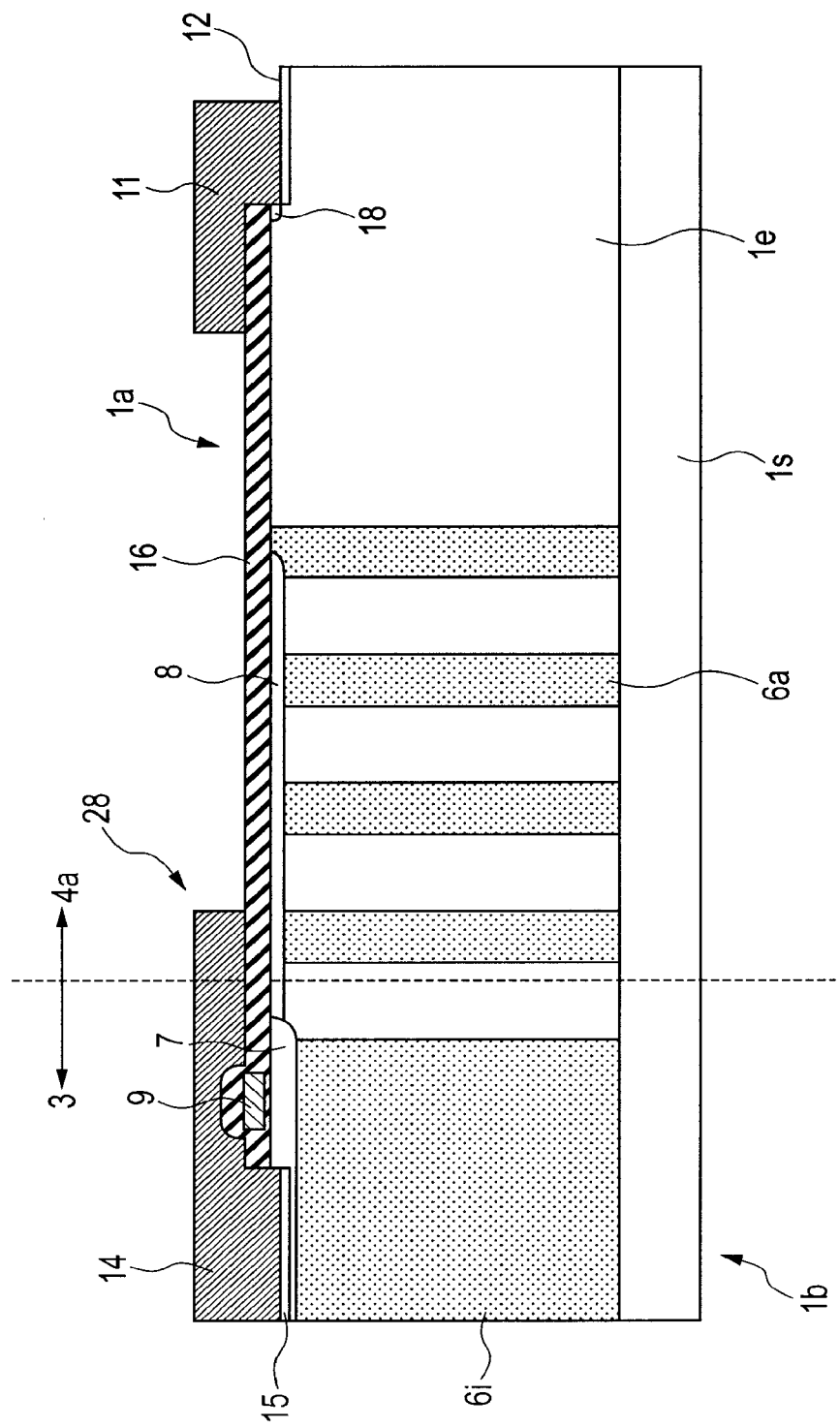
FIG. 26 is a sectional view of a device essential part corresponding to FIG. 3, etc. (virtually corresponding to the sectional view taken along the line A-A' of FIG. 2) for additional illustration of the field plate applied to the device structure (2D resurf structure) of a power MOSFET as a semiconductor device according to the first embodiment of the invention.
Figure 27:
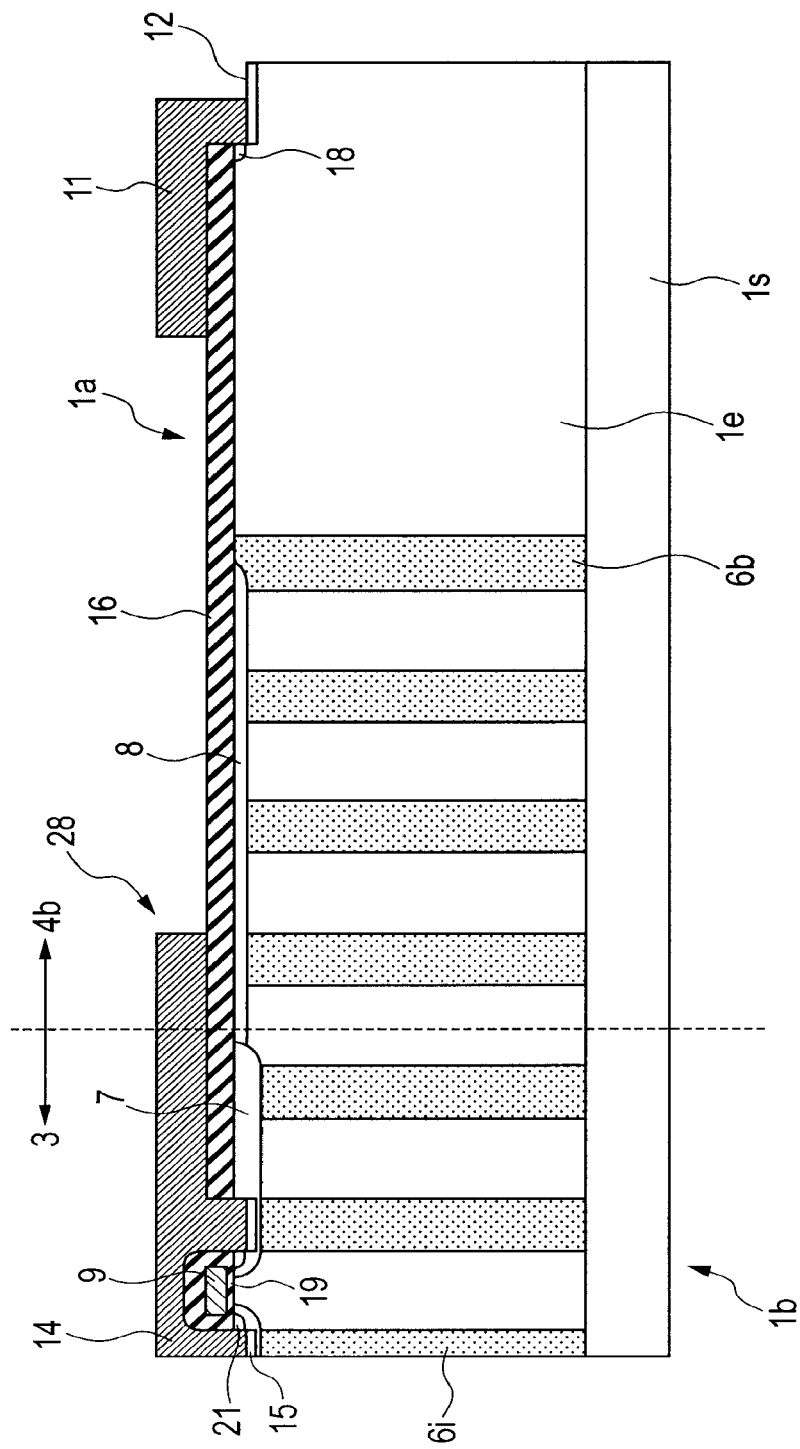
FIG. 27 is a sectional view of a device essential part corresponding to FIG. 4, etc. (virtually corresponding to the sectional view taken along the line B-B' of FIG. 2) for additional illustration of the field plate applied to the device structure (2D resurf structure) of a power MOSFET as a semiconductor device according to the first embodiment of the invention.

FIG. 26 is a sectional view of a device essential part corresponding to FIG. 3, etc. (virtually corresponding to the sectional view taken along the line A-A' of FIG. 2) for additional illustration of the field plate applied to the device structure (2D resurf structure) of a power MOSFET as a semiconductor device according to the first embodiment of the invention. FIG. 27 is a sectional view of a device essential part corresponding to FIG. 4, etc. (virtually corresponding to the sectional view taken along the line B-B' of FIG. 2) for additional illustration of the field plate applied to the device structure (2D resurf structure) of a power MOSFET as a semiconductor device according to the first embodiment of the invention. Referring to these drawings, application of the field plate to the device structure (2D resurf structure) of a power MOSFET as a semiconductor according to the first embodiment of the invention is explained below.

In this example, as shown in FIGS. 26 and 27, an extension of the metal source electrode 14 above the P− type surface resurf region 8 is used as a field plate 28. This field plate 28 reduces the possibility of undesired electric field concentration in the vicinity of an end of the P type well region 7.

7. Description of a Field Plate Applied to the Device Structure (3D Resurf Structure) of a Power MOSFET as a Semiconductor Device According to the Second Embodiment of the Invention (See Mainly FIGS. 28 and 29).

Although an outward extension of the source metal electrode is used as a field plate in this example, alternatively the field plate may be the floating field plate as described in Sections 8 and 9 which is coupled to the metal electrode and extended outward in the form of an insulating film. Obviously the field plate described here may be applied to the examples described in Sections 3 and 9.

Figure 28:
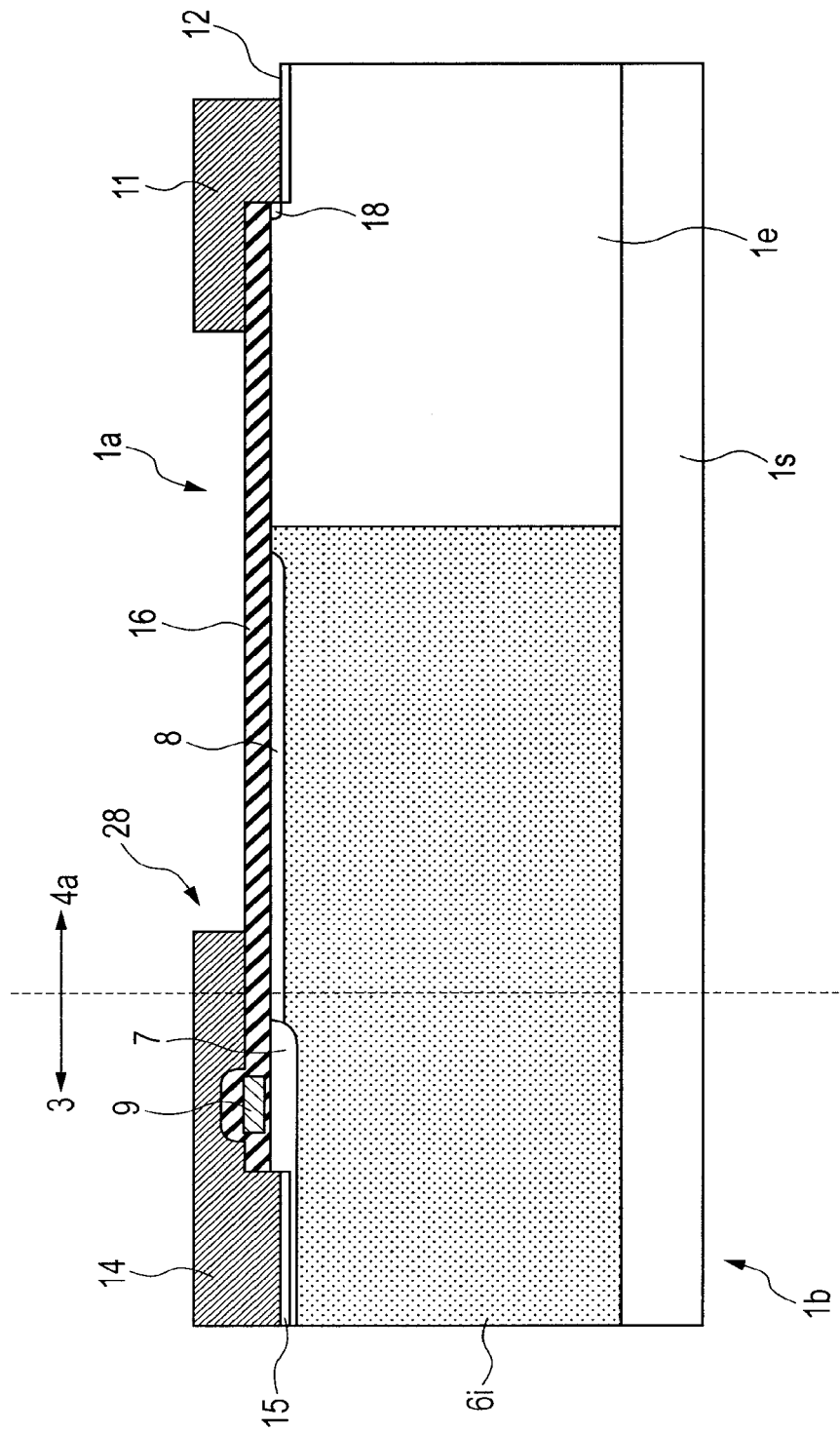
FIG. 28 is a sectional view of a device essential part corresponding to FIG. 20, etc. (virtually corresponding to the sectional view taken along the line A-A' of FIG. 19) for additional illustration of the field plate applied to the device structure (3D resurf structure) of a power MOSFET as a semiconductor device according to a second embodiment of the invention.
Figure 29:
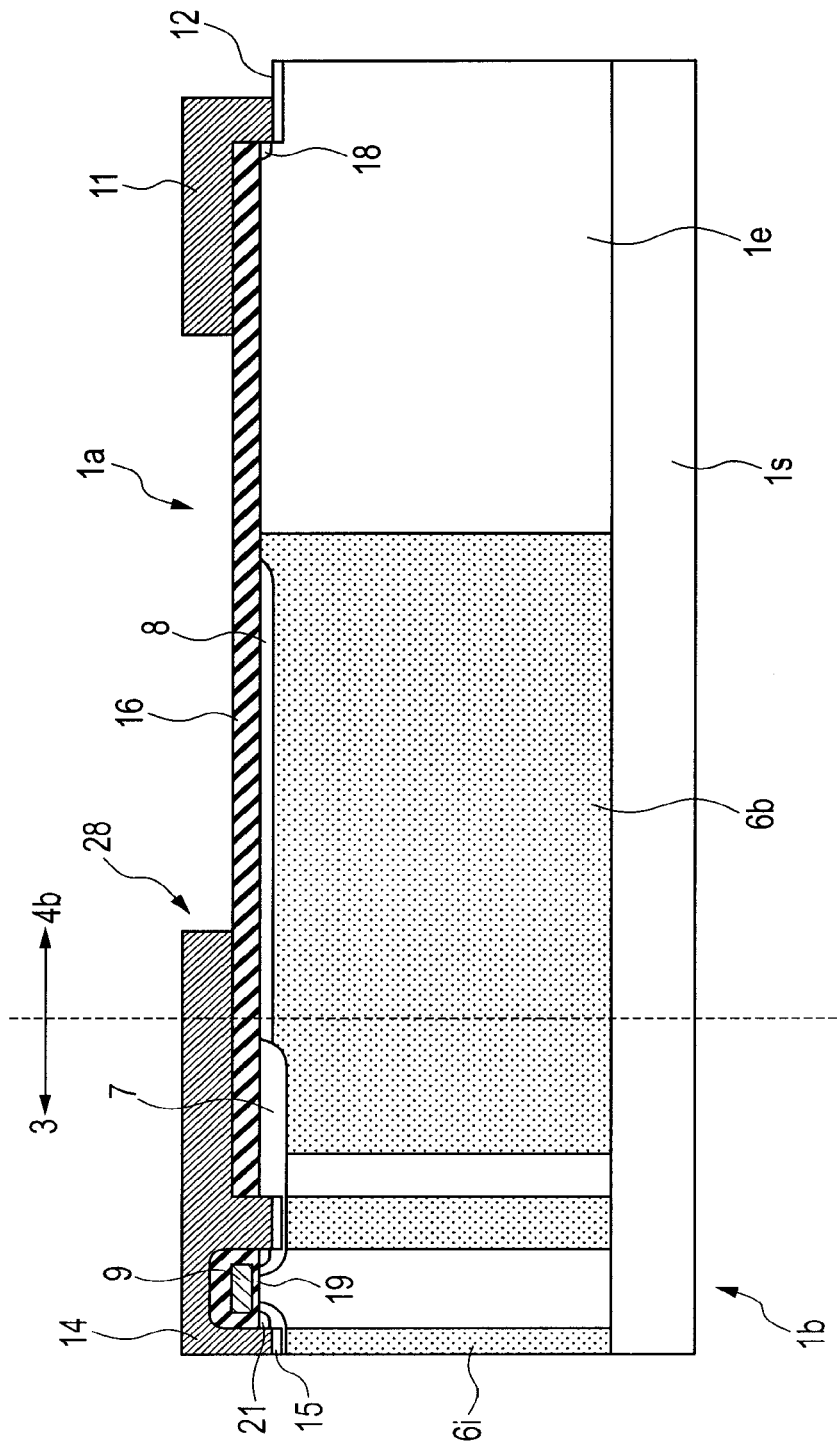
FIG. 29 is a sectional view of the device essential part corresponding to FIG. 21, etc. (virtually corresponding to the sectional view taken along the line B-B' of FIG. 19) for additional illustration of the field plate applied to the device structure (3D resurf structure) of a power MOSFET as a semiconductor device according to the second embodiment of the invention.

FIG. 28 is a sectional view of a device essential part corresponding to FIG. 20, etc. (virtually corresponding to the sectional view taken along the line A-A' of FIG. 19) for additional illustration of the field plate applied to the device structure (3D resurf structure) of a power MOSFET as a semiconductor device according to the second embodiment of the invention. FIG. 29 is a sectional view of the device essential part corresponding to FIG. 21, etc. (virtually corresponding to the sectional view taken along the line B-B' of FIG. 19) for additional illustration of the field plate applied to the device structure (3D resurf structure) of a power MOSFET as a semiconductor device according to the second embodiment of the invention. Referring to these drawings, application of the field plate to the device structure (3D resurf structure) of a power MOSFET as a semiconductor according to the second embodiment of the invention is explained below.

Like the example described in Section 6, in this example, as shown in FIGS. 28 and 29, an extension of the metal source electrode 14 above the P− type surface resurf region 8 is used as a field plate 28. This field plate 28 reduces the possibility of undesired electric field concentration in the vicinity of an end of the P type well region 7.

8. Description of a Floating Field Ring or Field Limiting Ring Applied to the Device Structure (2D Resurf Structure) of a Power MOSFET as a Semiconductor Device According to the First Embodiment of the Invention (See Mainly FIGS. 30 to 32).

Obviously the field plate described here may be applied to the examples described in Sections 1, 4, 5, and 6.

Figure 30:
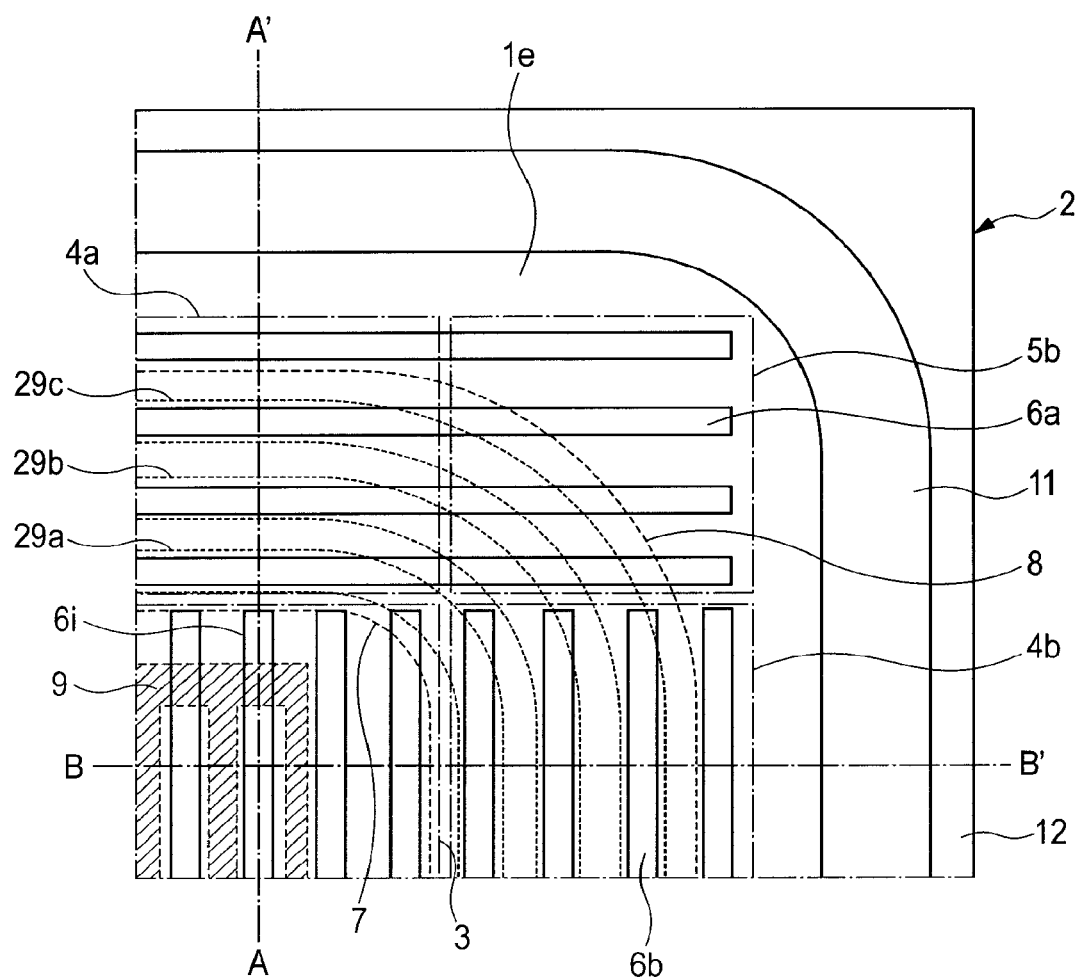
FIG. 30 is an enlarged plan view of the layout of a chip corner CR including the right upper end of the cell region, corresponding to FIG. 2, etc. for additional illustration of the floating field ring or field limiting ring applied to the device structure (2D resurf structure) of a power MOSFET as a semiconductor device according to the first embodiment of the invention.
Figure 31:
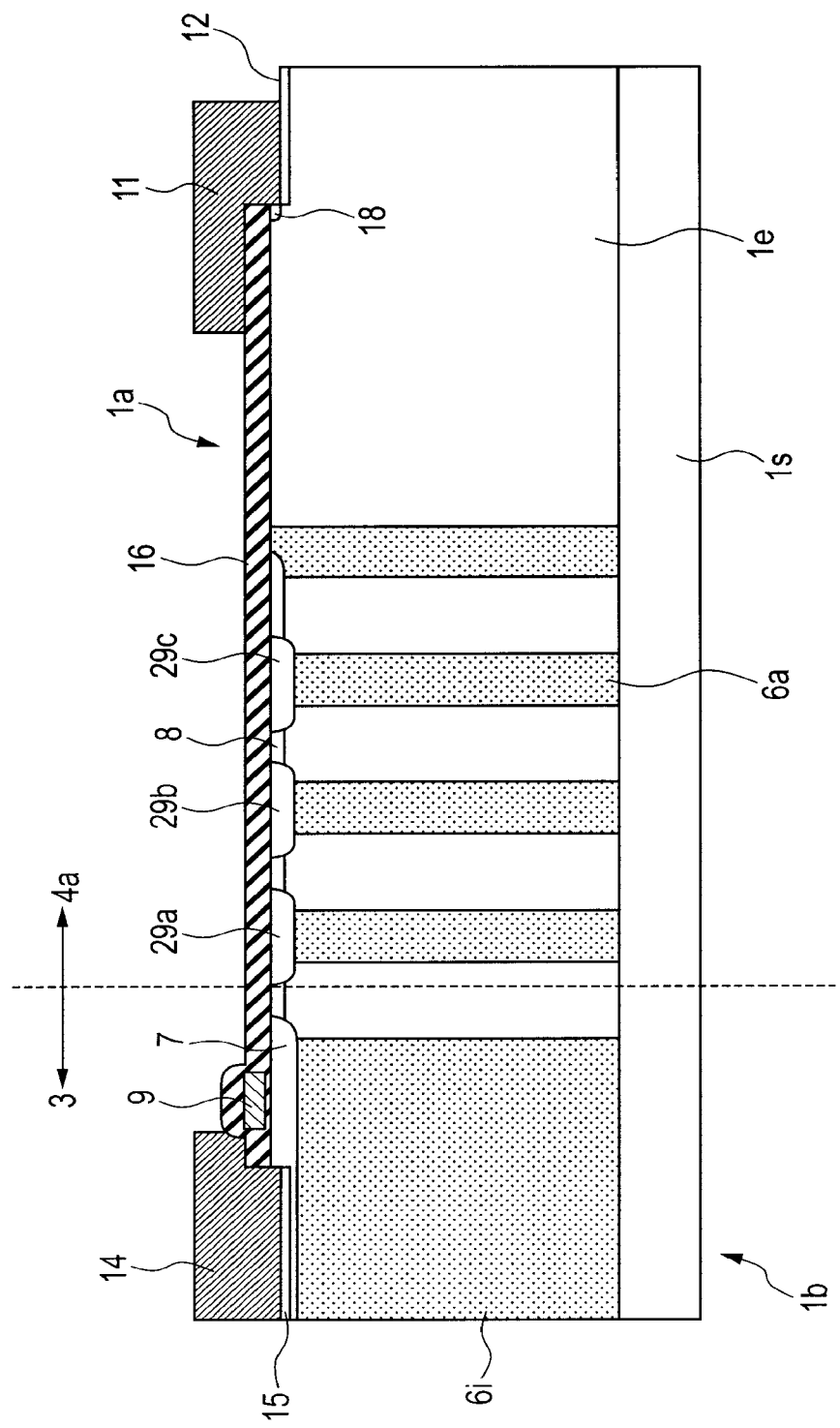
FIG. 31 is a sectional view of a device essential part corresponding to FIG. 3, etc. (virtually corresponding to the sectional view taken along the line A-A' of FIG. 2) for additional illustration of the floating field ring or field limiting ring applied to the device structure (2D resurf structure) of a power MOSFET as a semiconductor device according to the first embodiment of the invention.
Figure 32:
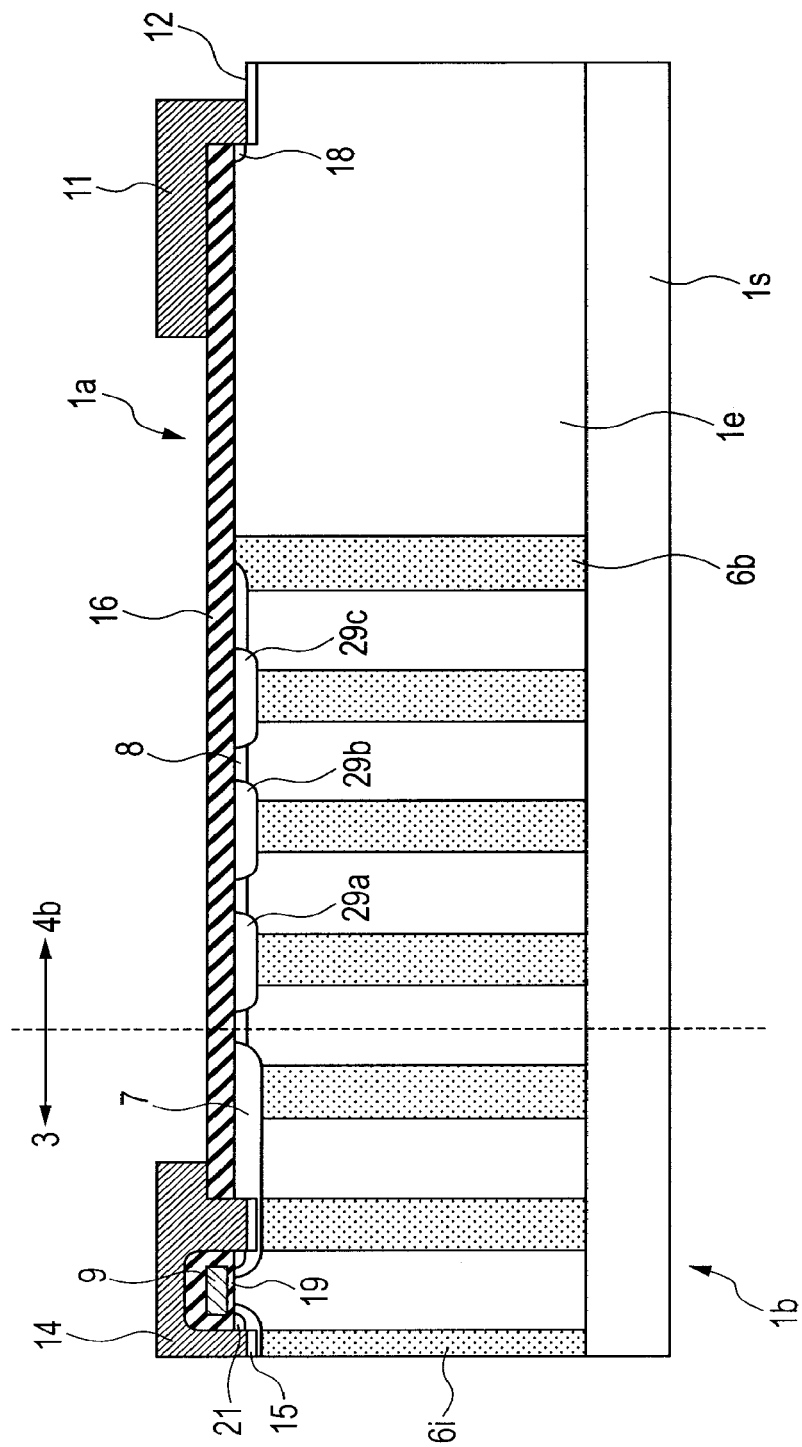
FIG. 32 is a sectional view of the device essential part corresponding to FIG. 4, etc. (virtually corresponding to the sectional view taken along the line B-B' of FIG. 2) for additional illustration of the floating field ring or field limiting ring applied to the device structure (2D resurf structure) of a power MOSFET as a semiconductor device according to the first embodiment of the invention.

FIG. 30 is an enlarged plan view of the layout of a chip corner CR including the right upper end of the cell region, corresponding to FIG. 2, etc. for additional illustration of the floating field ring or field limiting ring applied to the device structure (2D resurf structure) of a power MOSFET as a semiconductor device according to the first embodiment of the invention. FIG. 31 is a sectional view of a device essential part corresponding to FIG. 3, etc. (virtually corresponding to the sectional view taken along the line A-A' of FIG. 2) for additional illustration of the floating field ring or field limiting ring applied to the device structure (2D resurf structure) of a power MOSFET as a semiconductor device according to the first embodiment of the invention. FIG. 32 is a sectional view of the device essential part corresponding to FIG. 4, etc. (virtually corresponding to the sectional view taken along the line B-B' of FIG. 2) for additional illustration of the floating field ring or field limiting ring applied to the device structure (2D resurf structure) of a power MOSFET as a semiconductor device according to the first embodiment of the invention. Referring to these drawings, application of the floating field ring or field limiting ring to the device structure (2D resurf structure) of a power MOSFET as a semiconductor according to the first embodiment of the invention is explained below.

In this example, as shown in FIGS. 30 to 32, P type surface impurity regions 29a, 29b, and 29c (floating field rings) are provided in a way to virtually overlap P type columns 6 (6a, 6b, 6c, and 6d) near the cell region 3, in which they have a higher doping concentration than the P type columns 6 and P− type surface resurf region 8. This offers an advantage that the spread of the depletion layer is promoted and electric field concentration is avoided. The floating field rings 29a, 29b, and 29c are usually the same impurity regions as the P type well region 7.

9. Description of a Floating Field Ring or Field Limiting Ring Applied to the Device Structure (3D Resurf Structure) of a Power MOSFET as a Semiconductor Device According to the Second Embodiment of the Invention (See Mainly FIGS. 33 to 35).

Obviously the floating field ring or field limiting ring described here may be applied to the examples described in Sections 3 and 7.

Figure 33:
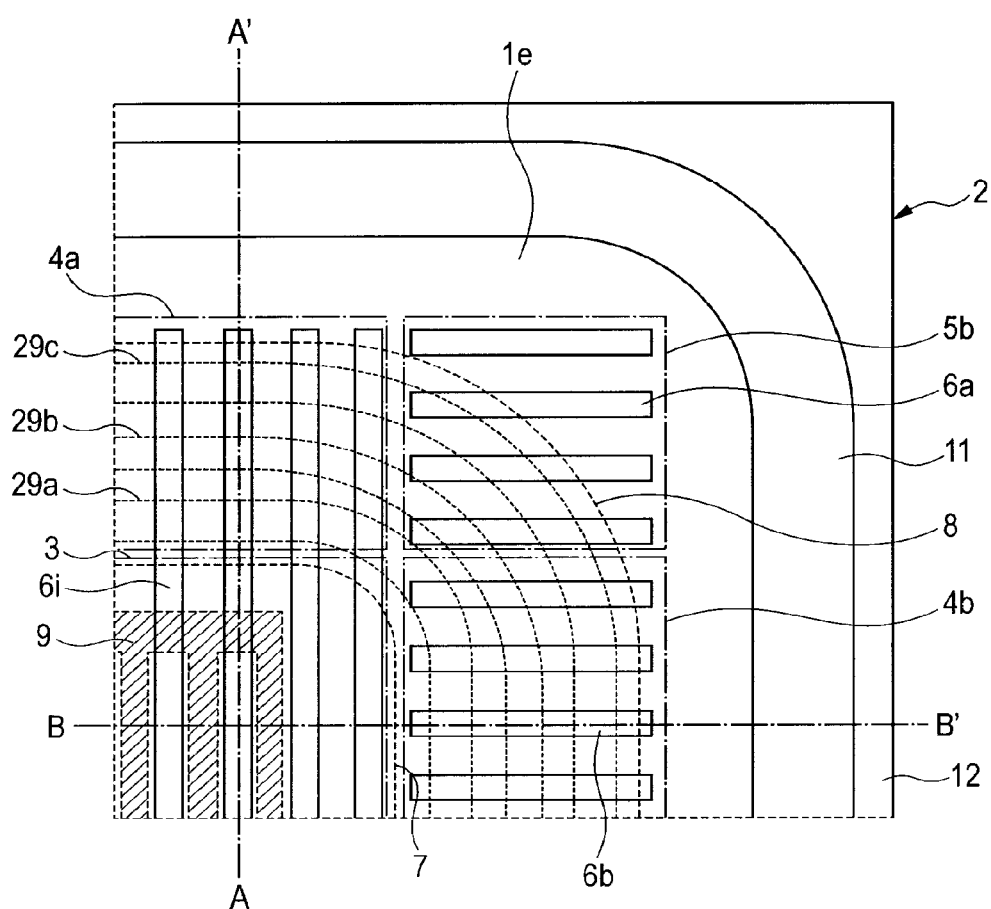
FIG. 33 is an enlarged plan view of the layout of a chip corner CR including the right upper end of the cell region, corresponding to FIG. 19, etc. for additional illustration of the floating field ring or field limiting ring applied to the device structure (3D resurf structure) of a power MOSFET as a semiconductor device according to the second embodiment of the invention.
Figure 34:
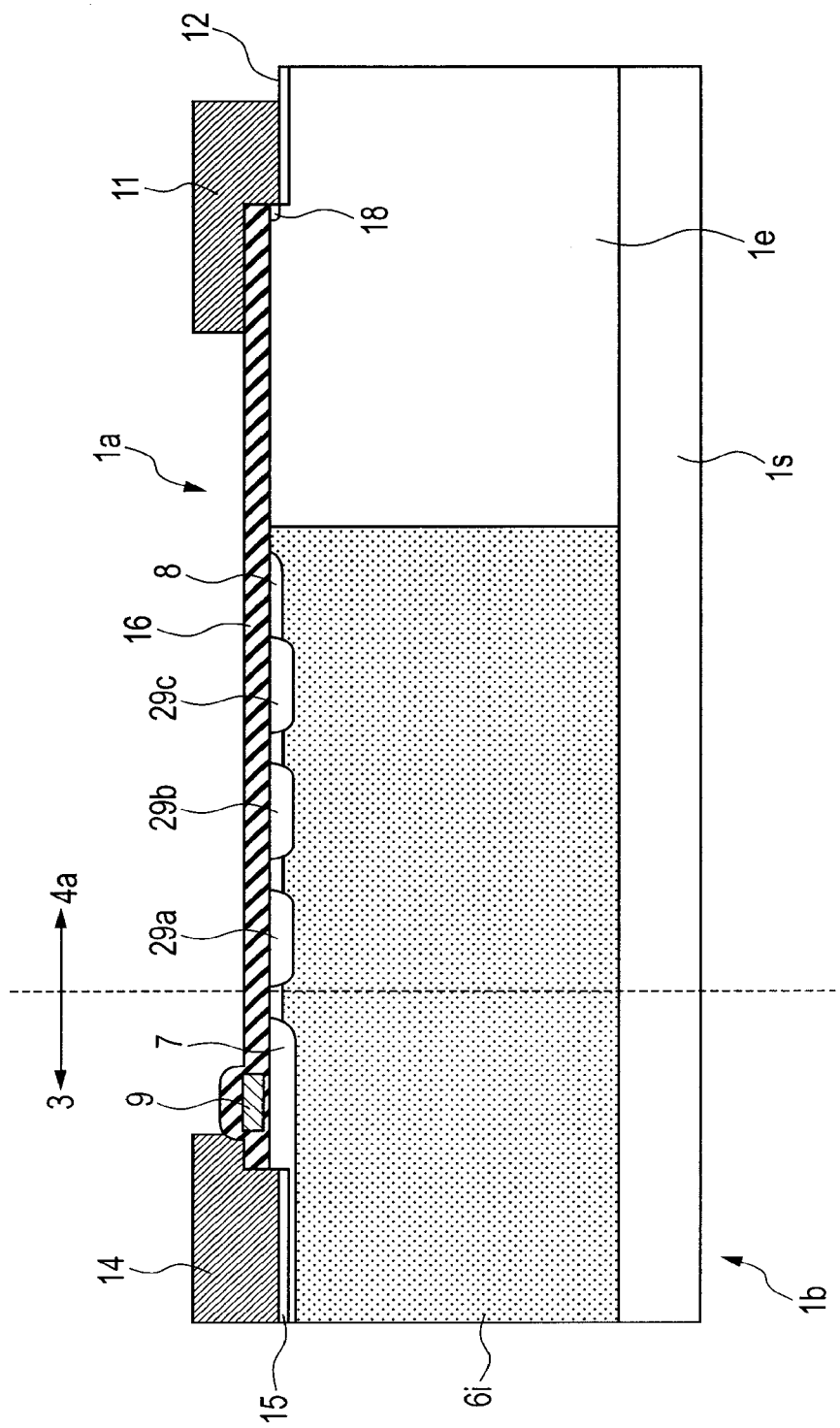
FIG. 34 is a sectional view of a device essential part corresponding to FIG. 20, etc. (virtually corresponding to the sectional view taken along the line A-A' of FIG. 19) for additional illustration of the floating field ring or field limiting ring applied to the device structure (3D resurf structure) of a power MOSFET as a semiconductor device according to the second embodiment of the invention.

FIG. 33 is an enlarged plan view of the layout of a chip corner CR including the right upper end of the cell region corresponding to FIG. 19, etc. for additional illustration of the floating field ring or field limiting ring applied to the device structure (3D resurf structure) of a power MOSFET as a semiconductor device according to the second embodiment of the invention. FIG. 34 is a sectional view of a device essential part corresponding to FIG. 20, etc. (virtually corresponding to the sectional view taken along the line A-A' of FIG. 19) for additional illustration of the floating field ring or field limiting ring applied to the device structure (3D resurf structure) of a power MOSFET as a semiconductor device according to the second embodiment of the invention. FIG. 35 is a sectional view of the device essential part corresponding to FIG. 21, etc. (virtually corresponding to the sectional view taken along the line B-B' of FIG. 19) for additional illustration of the floating field ring or field limiting ring applied to the device structure (3D resurf structure) of a power MOSFET as a semiconductor device according to the second embodiment of the invention. Referring to these drawings, application of the floating field ring or field limiting ring to the device structure (3D resurf structure) of a power MOSFET as a semiconductor device according to the second embodiment of the invention is explained below.

In this example, as shown in FIGS. 33 to 35, P type surface impurity regions 29a, 29b, and 29c (floating field rings) are provided along the periphery of the P type well region 7, in which they have a higher concentration than the P type columns 6 and P− type surface resurf region 8. This offers an advantage that the spread of the depletion layer is promoted and electric field concentration is avoided. The floating field rings 29a, 29b, and 29c are usually the same impurity regions as the P type well region 7.

10. Summary

The invention made by the present inventors has been so far concretely explained in reference to preferred embodiments thereof. However, the invention is not limited thereto and it is needless to say that these details may be modified in various ways without departing from the spirit and scope thereof.

For example, although the MOS structure with a planar gate has been taken as an example in the descriptions of the aforementioned embodiments, the invention is not limited thereto. Obviously the invention may be applied to the trench gate structure of a U-MOSFET or the like in the same way. Regarding MOSFET layout, the aforementioned embodiments employs a stripe pattern arrangement parallel to p-n columns; however, alternatively, an arrangement perpendicular to p-n columns or a grid pattern arrangement may be employed.

In the aforementioned embodiments, an N channel device is mainly formed over the upper surface of an N epitaxial layer over an N+ silicon single-crystal substrate; however, the present invention is not limited thereto. According to the invention, a P channel device may be formed over the upper surface of an N epitaxial layer over a P+ silicon single-crystal substrate.

In the aforementioned embodiments, a power MOSFET is taken as an example; however, the present invention is not limited thereto. Obviously, the invention may be applied to a power device with a super junction structure, specifically a diode, bipolar transistor or the like. Also it may be applied to a semiconductor integrated circuit device which incorporates a power MOSFET, diode, bipolar transistor or the like.

Furthermore, the aforementioned embodiments are described on the assumption that the trench fill technique is mainly adopted for the formation of a super junction structure; however, the present invention is not limited thereto. It is needless to say that the multi-epitaxial technique may be adopted instead.

What is claimed is:

1. A semiconductor device comprising:
   a semiconductor substrate of a first conductive type having first and second sides arranged along a first direction, and third and fourth sides arranged along a second direction which is perpendicular to the first direction;
   a drift region of the first conductive type formed on the semiconductor substrate;
   a cell region arranged in the drift region;
   a plurality of power MOSFETs formed in the cell region;
   a first peripheral region arranged in the drift region and arranged between the cell region and the first side;
   a second peripheral region arranged in the drift region and arranged between the cell region and the second side;
   a third peripheral region arranged in the drift region and arranged between the cell region and the third side; and
   a fourth peripheral region arranged in the drift region and arranged between the cell region and the fourth side,
   wherein the first peripheral region has a plurality of first columns of the second conductive type opposite to the first conductive type which are formed in the drift region and which extend along the first direction, wherein the second peripheral region has a plurality of second columns of the second conductive type which are formed in the drift region and which extend along the first direction, wherein the third peripheral region has a plurality of third columns of the second conductive type which are formed in the drift region and which extend along the second direction, wherein the fourth peripheral region has a plurality of fourth columns of the second conductive type which are formed in the drift region and which extend along the second direction, wherein the cell region has a plurality of fifth columns of the second conductive type which are formed in the drift region and which extend along the first direction, wherein a resurf region of the second conductive type is formed in the drift region and is arranged at upper portions of the first, second, third and fourth columns, wherein a plurality of gate electrodes of the power MOSFETs are formed over the drift region of the cell region, wherein a plurality of well regions of the second conductive type are formed in the drift region of the cell region, are arranged at upper portions of the fifth columns and have higher impurity concentration than the resurf region, wherein a plurality of source regions of the power MOSFETs of the first conductive type are formed in the well regions, wherein, in the first direction, the cell region, the first peripheral region and the second peripheral region are arranged between the third peripheral region and the fourth peripheral region, wherein the third column and the fourth column extend along the second direction in order to abut the cell region, the first peripheral region and the second peripheral region in the first direction, wherein a plurality of impurity regions of the second conductive type having higher impurity concentration than the resurf region are formed in the first, second, third and fourth peripheral regions in order to contact with the resurf region and each of the first, second, third and fourth columns, wherein the impurity region formed in the first peripheral region extends along the first column, wherein the impurity region formed in the second peripheral region extends along the second column, wherein the impurity region formed in the third peripheral region extends along the third column, and wherein the impurity region formed in the fourth peripheral region extends along the fourth column.

2. A semiconductor device according to the claim 1, wherein the first, second, third, fourth and fifth columns are physically separated from each other.

3. A semiconductor device according to the claim 1, wherein a guard ring is formed over the epitaxial layer, is formed of a metal film and is arranged along each of the first, second, third and fourth sides in order to surround each of the first, second, third and fourth peripheral regions.

4. A semiconductor device according to the claim 1, wherein a junction depth of each of the well regions is deeper than that of the resurf region.

5. A semiconductor device according to the claim 1, wherein a junction depth of each of the impurity regions is deeper than that of the resurf region.

6. A semiconductor device according to the claim 1, wherein a field plate is formed over the resurf region and is connected to the same voltage as the source regions.

7. A semiconductor device according to the claim 1, wherein the first conductive type is an n-type, and wherein the second conductive type is a p-type.

8. A semiconductor device according to the claim 1, wherein the first, second, third, fourth and fifth columns are formed by an epitaxial growth method and are buried in trenches which are formed in the drift region.

9. A semiconductor device according to the claim 1, wherein the power MOSFETs are not formed in the first, second, third and fourth peripheral regions.

10. A semiconductor device according to the claim 1, wherein the resurf region is not formed in the cell region.

* * * * *